(12) United States Patent
Cheng et al.

(10) Patent No.: US 8,889,564 B2
(45) Date of Patent: Nov. 18, 2014

(54) SUSPENDED NANOWIRE STRUCTURE

(75) Inventors: Kangguo Cheng, Schenectady, NY (US); James J. Demarest, Rensselaer, NY (US); Balasubramanian S. Haran, Watervliet, NY (US)

(73) Assignee: International Business Machines Corporation, Armonk, NY (US)

( * ) Notice: Subject to any disclaimer, the term of this patent is extended or adjusted under 35 U.S.C. 154(b) by 123 days.

(21) Appl. No.: 13/600,324

(22) Filed: Aug. 31, 2012

(65) Prior Publication Data

US 2014/0061582 A1 Mar. 6, 2014

(51) Int. Cl.
*H01L 21/302* (2006.01)
*H01L 21/461* (2006.01)

(52) U.S. Cl.
USPC ............ 438/739; 438/738; 438/142; 438/197; 438/222; 438/269; 257/E21.633; 257/E29.07; 257/E29.245

(58) Field of Classification Search
CPC ............ H01L 29/0673; H01L 29/0669; H01L 29/0665; H01L 29/42392
USPC ................. 438/142, 197, 738, 739, 222, 269; 257/E21.633, E29.07, E29.245
See application file for complete search history.

(56) References Cited

U.S. PATENT DOCUMENTS

| | | | |
|---|---|---|---|
| 6,794,306 B2 * | 9/2004 | Kim et al. | 438/752 |
| 7,274,051 B2 * | 9/2007 | Kim et al. | 257/213 |
| 7,642,177 B2 | 1/2010 | Cho | |
| 7,821,061 B2 | 10/2010 | Jin et al. | |
| 8,143,623 B2 * | 3/2012 | Cheng et al. | 257/66 |
| 2005/0112817 A1 | 5/2005 | Cheng et al. | |
| 2007/0128786 A1 | 6/2007 | Cheng et al. | |
| 2009/0294864 A1 | 12/2009 | Suk et al. | |
| 2010/0051899 A1 | 3/2010 | Cho | |
| 2010/0163838 A1 | 7/2010 | Chu-Kung et al. | |
| 2010/0164102 A1 | 7/2010 | Rachmady et al. | |
| 2010/0200835 A1 | 8/2010 | Jin et al. | |
| 2011/0133161 A1 | 6/2011 | Bangsaruntip et al. | |
| 2011/0133169 A1 | 6/2011 | Bangsaruntip et al. | |
| 2011/0233522 A1 | 9/2011 | Cohen et al. | |
| 2011/0253981 A1 | 10/2011 | Rooyackers et al. | |
| 2012/0138886 A1 | 6/2012 | Kuhn et al. | |

FOREIGN PATENT DOCUMENTS

CN 102082096 A 6/2011
KR 1020100023493 3/2010

* cited by examiner

*Primary Examiner* — Matthew W. Such
*Assistant Examiner* — Jesse Y Miyoshi
(74) *Attorney, Agent, or Firm* — Scully, Scott, Murphy & Presser, P.C.; Joseph P. Abate, Esq.

(57) ABSTRACT

A mandrel having vertical planar surfaces is formed on a single crystalline semiconductor layer. An epitaxial semiconductor layer is formed on the single crystalline semiconductor layer by selective epitaxy. A first spacer is formed around an upper portion of the mandrel. The epitaxial semiconductor layer is vertically recessed employing the first spacers as an etch mask. A second spacer is formed on sidewalls of the first spacer and vertical portions of the epitaxial semiconductor layer. Horizontal bottom portions of the epitaxial semiconductor layer are etched from underneath the vertical portions of the epitaxial semiconductor layer to form a suspended ring-shaped semiconductor fin that is attached to the mandrel. A center portion of the mandrel is etched employing a patterned mask layer that covers two end portions of the mandrel. A suspended semiconductor fin is provided, which is suspended by a pair of support structures.

10 Claims, 30 Drawing Sheets

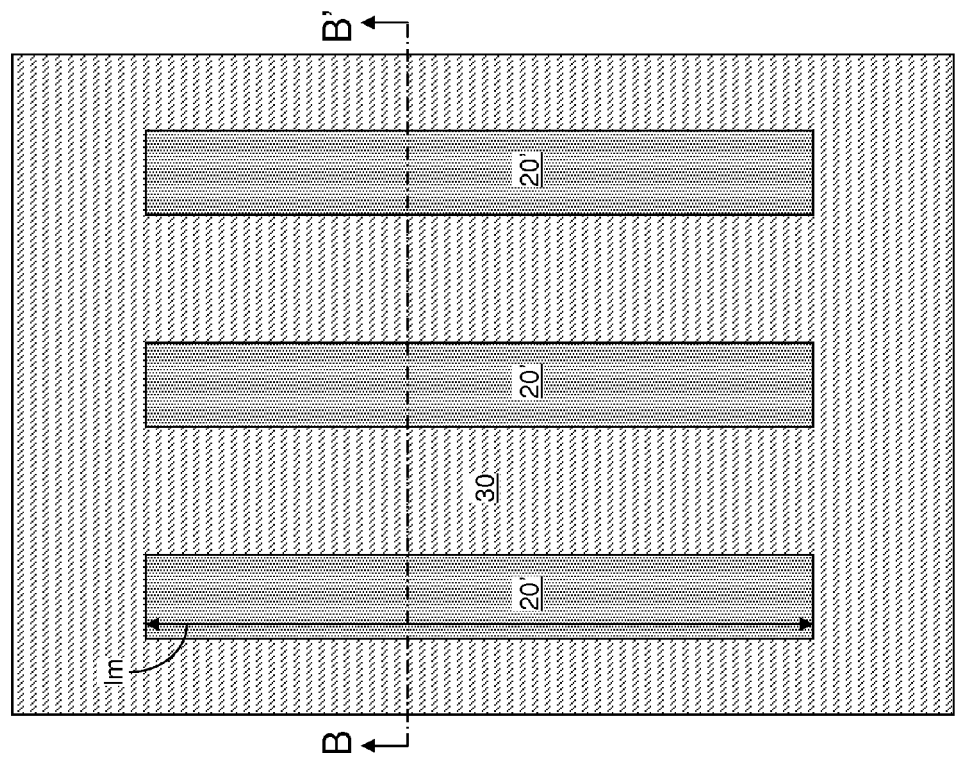

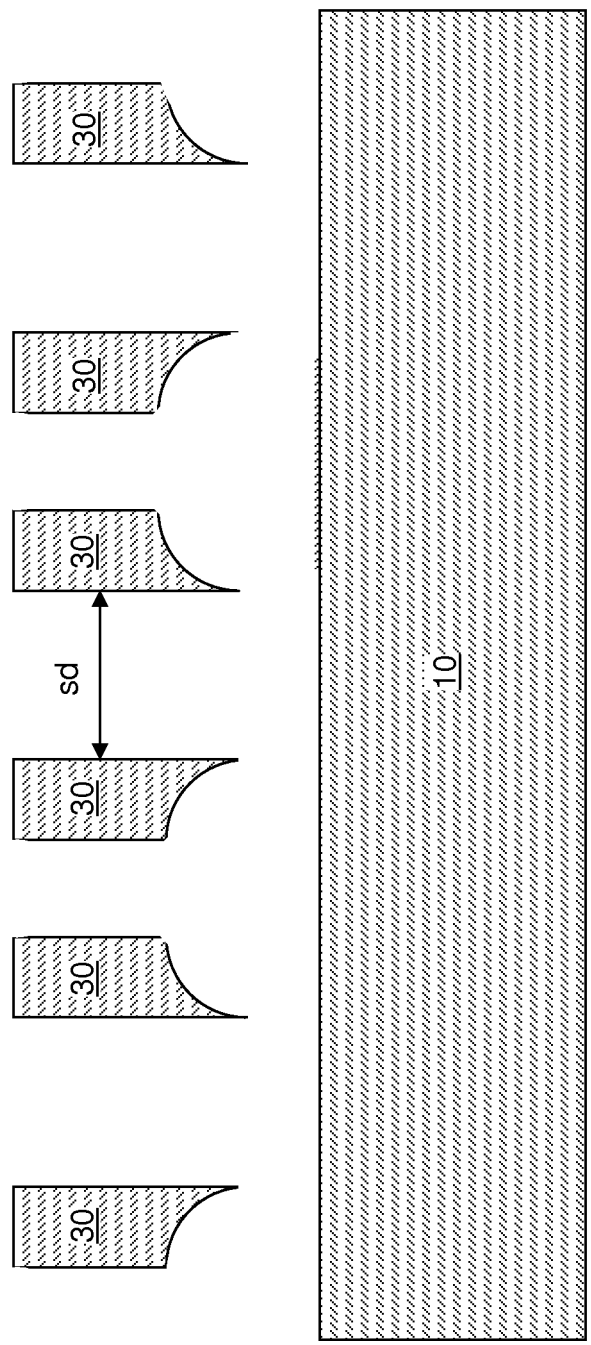

SUSPENDED NANOWIRE STRUCTURE

BACKGROUND

The present disclosure generally relates to semiconductor structures, and particularly to suspended semiconductor nanowires, and methods of manufacturing the same.

Semiconductor nanowires are employed to form various semiconductor devices such as field effect transistors. Methods for forming semiconductor nanowires as known in the art require use of a semiconductor-on-insulator (SOI) substrate, which is more expensive than a bulk semiconductor substrate. Further, types of semiconductor nanowires that can be formed by methods known in the art are limited by the availability of an SOI substrate including the desired material for the semiconductor nanowires within the top semiconductor layer of the SOI substrate.

SUMMARY

A mandrel having vertical planar surfaces is formed on a single crystalline semiconductor layer. An epitaxial semiconductor layer is formed on the single crystalline semiconductor layer by selective epitaxy. A first spacer is formed around an upper portion of the mandrel. The epitaxial semiconductor layer is vertically recessed employing the first spacers as an etch mask. A second spacer is formed on sidewalls of the first spacer and vertical portions of the epitaxial semiconductor layer. Horizontal bottom portions of the epitaxial semiconductor layer are etched from underneath the vertical portions of the epitaxial semiconductor layer to form a suspended ring-shaped semiconductor fin that is attached to the mandrel. A center portion of the mandrel is etched employing a patterned mask layer that covers two end portions of the mandrel. A suspended semiconductor fin is provided, which is suspended by a pair of support structures.

According to an aspect of the present disclosure, a method of forming a semiconductor structure is provided. A mandrel structure is formed on a portion of a surface of a substrate semiconductor layer. An epitaxial semiconductor layer is formed on another portion of the surface of the substrate semiconductor layer. A first dielectric spacer is formed on sidewalls of the mandrel structure and on portions of a top surface of the epitaxial semiconductor layer. Physically exposed portions of the epitaxial semiconductor layer are recessed employing the first dielectric spacer as an etch mask. A second dielectric spacer is formed on sidewalls of the first dielectric spacer and sidewalls of recessed portions of the epitaxial semiconductor layer. A ring-shaped semiconductor nanowire is formed by etching the epitaxial semiconductor layer from the recessed portions. A remaining portion of the epitaxial semiconductor layer is the ring-shaped semiconductor nanowire.

According to another aspect of the present disclosure, a semiconductor structure is provided, which includes a pair of support structures located on a substrate semiconductor layer; and a ring-shaped semiconductor nanowire vertically spaced from the substrate semiconductor layer and contacting outer sidewall surfaces of the pair of support structures. Two portions of the ring-shaped semiconductor nanowire do not contact the pair of support structures.

BRIEF DESCRIPTION OF SEVERAL VIEWS OF THE DRAWINGS

FIG. 2A is a top-down view of the exemplary semiconductor structure after formation of an epitaxial semiconductor layer according to an embodiment of the present disclosure.

FIG. 8B is a vertical cross-sectional view of the exemplary semiconductor structure along the vertical plane B-B' of FIG. 8A.

DETAILED DESCRIPTION

Figure 1A:
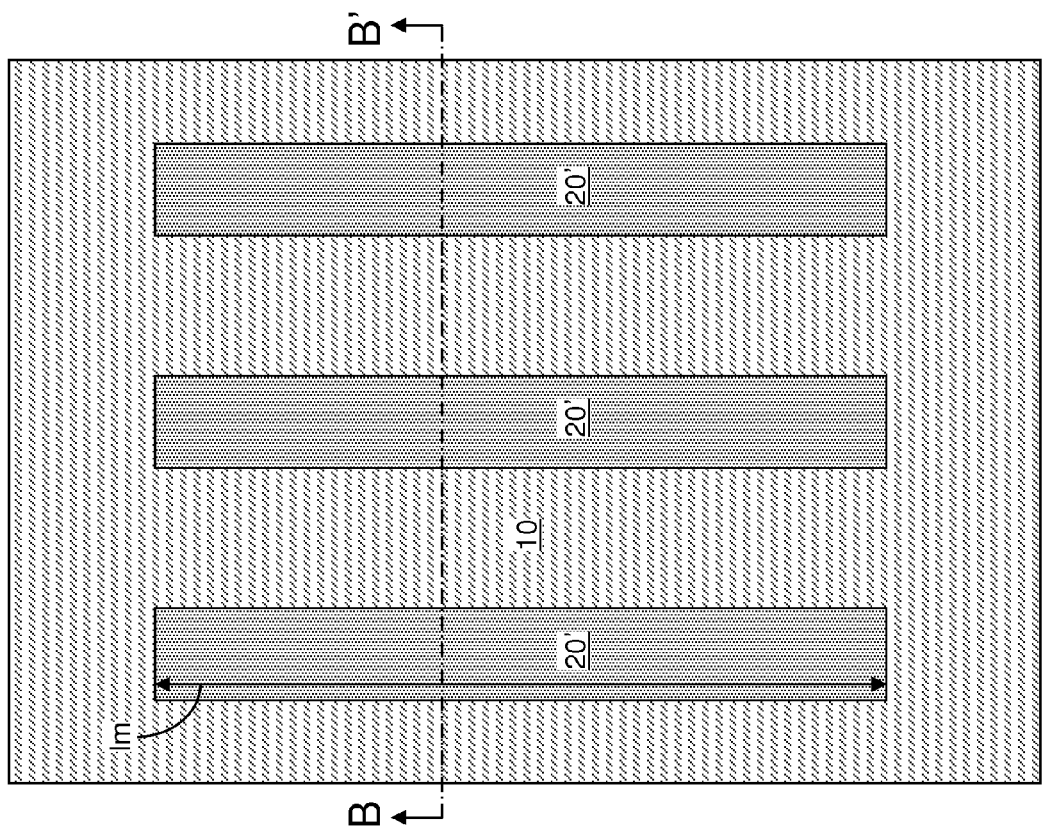
FIG. 1A is a top-down view of an exemplary semiconductor structure after formation of mandrel structures according to an embodiment of the present disclosure.

As stated above, the present disclosure relates to suspended semiconductor nanowires, and methods of manufacturing the same, aspects of which are now described in detail with accompanying figures. It is noted that like reference numerals refer to like elements across different embodiments. The drawings are not necessarily drawn to scale.

Figure 1B:
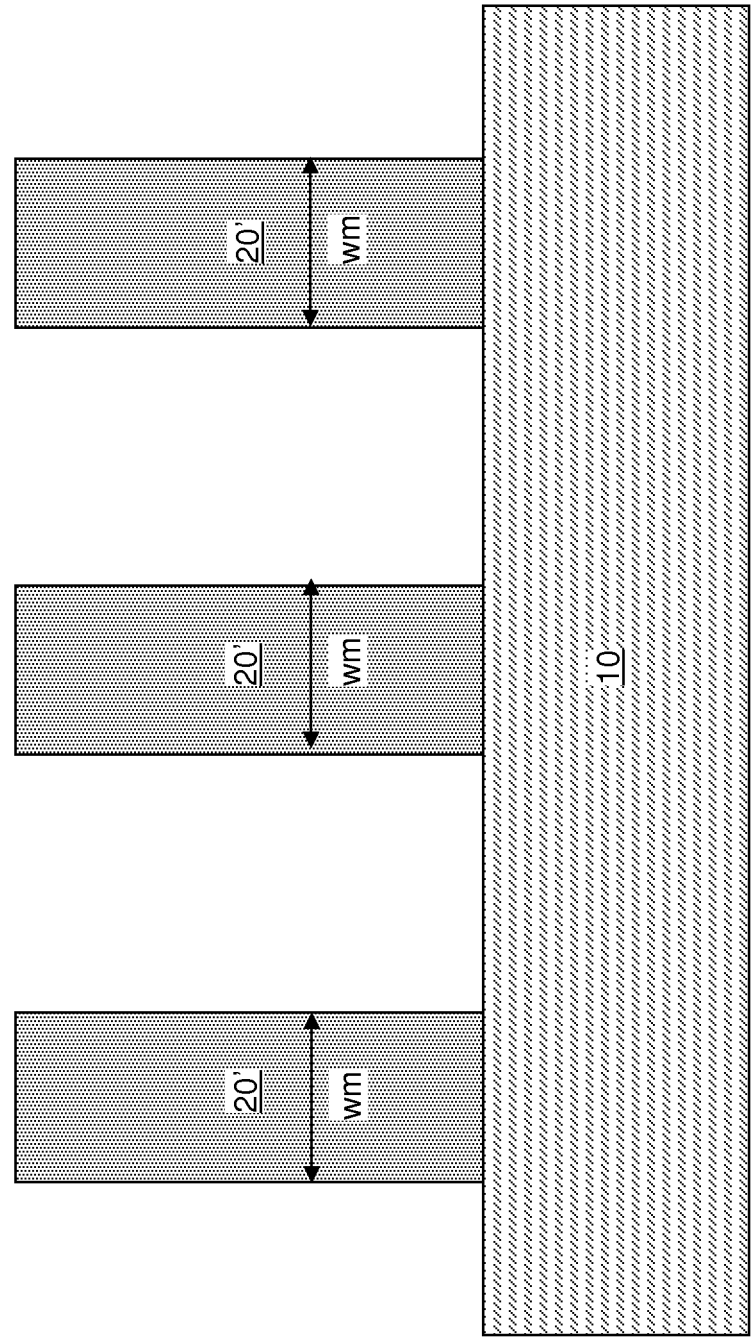
FIG. 1B is a vertical cross-sectional view of the exemplary semiconductor structure along the vertical plane B-B' of FIG. 1A.

Referring to FIGS. 1A and 1B, an exemplary semiconductor structure according to an embodiment of the present disclosure includes a substrate semiconductor layer 10 including a single crystalline semiconductor material. The single crystalline semiconductor material can be, for example, a single crystalline elemental semiconductor material such as silicon or germanium, a single crystalline semiconductor material of at least two elemental semiconductor materials such as a silicon-germanium alloy or a silicon-carbon alloy, or a single crystalline semiconductor material of a compound semiconductor such as a III-V compound semiconductor or a II-VI compound semiconductor.

A plurality of mandrel structures 20' can be formed on portions of the top surface of the substrate semiconductor layer 10. The plurality of mandrel structures 20' includes a dielectric material such as silicon oxide, silicon nitride, silicon oxynitride, a dielectric metal oxide, or a dielectric metal nitride. In one embodiment, the plurality of mandrel structures 20' can include silicon oxide.

The plurality of mandrel structures 20' can be formed, for example, by depositing a dielectric material layer on the top surface of the substrate semiconductor layer 10, and subsequently patterning the dielectric material layer. The dielectric material layer can be deposited, for example, by chemical vapor deposition (CVD). The patterning of the dielectric material layer can be performed by applying a photoresist layer over the dielectric material layer, lithographically patterning the dielectric material layer, and transferring the pattern in the photoresist layer into the underlying dielectric material layer, for example, by an anisotropic etch.

Each mandrel structures 20' can have a pair of parallel sidewalls separated by the width of the mandrel structure, i.e., the mandrel structure width wm. The mandrel structure width wm can be from 5 nm to 200 nm, although lesser and greater mandrel structure widths wm can also be employed. Each mandrel structure 20' can extend along a horizontal direction parallel to the pair of sidewalls. The dimension of a mandrel structure 20' along the horizontal direction parallel to the pair of sidewalls is herein referred to as a mandrel structure length lm. The mandrel structure length lm can be from 50 nm to 2,000 nm, although lesser and greater mandrel structure lengths lm can also be employed. In one embodiment, each mandrel structure 20' can have a rectangular horizontal cross-sectional area. The height of the mandrel structures 20' can be from 20 nm to 1,000 nm, although lesser and greater heights can also be employed.

Figure 2B:
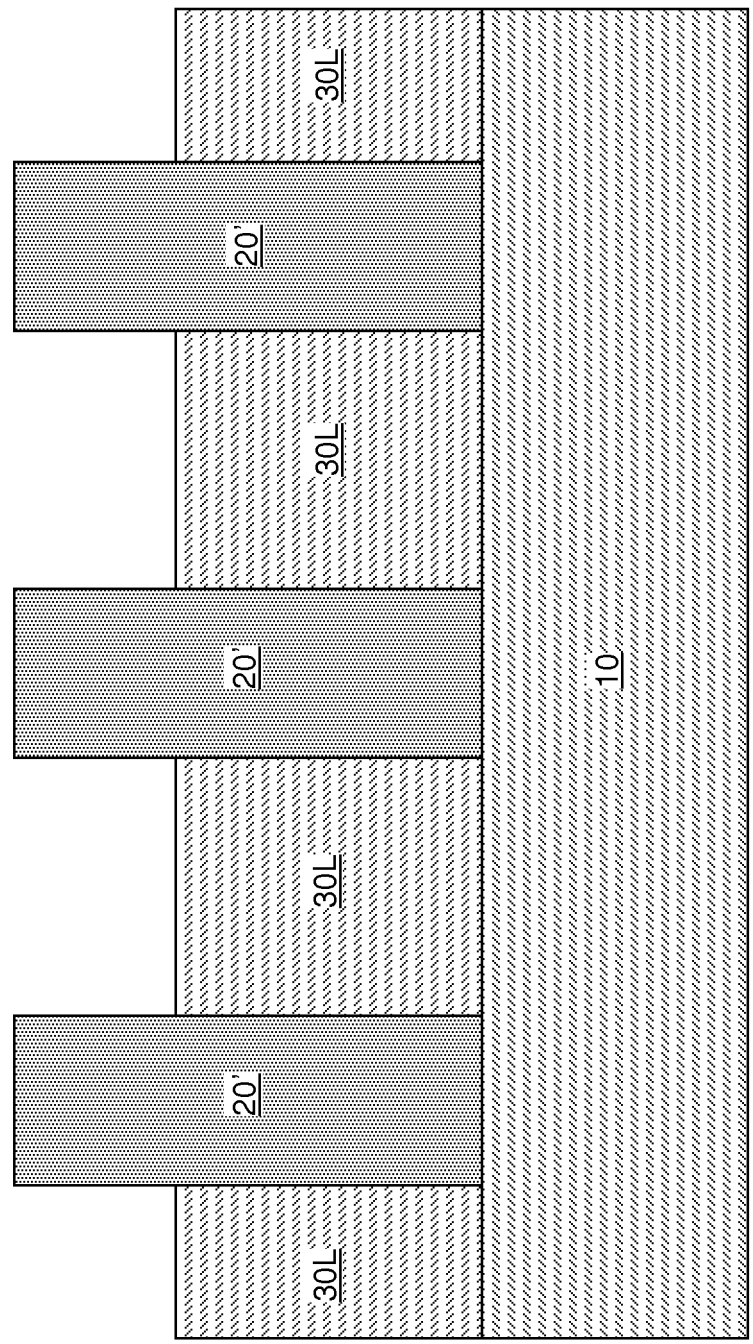
FIG. 2B is a vertical cross-sectional view of the exemplary semiconductor structure along the vertical plane B-B' of FIG. 2A.

Referring to FIGS. 2A and 2B, an epitaxial semiconductor layer 30L is formed on the top surface of the substrate semiconductor layer 10 and between the mandrel structures 20' by selective epitaxy of a semiconductor material. The epitaxial semiconductor layer 30L is formed in epitaxial alignment with the single crystalline structure of the substrate semiconductor layer 30L. As used herein, "epitaxial" alignment refers to alignment of atoms in a same singe crystalline structure. The epitaxially deposited semiconductor material that forms the epitaxial semiconductor layer 30L can be the same as, or different from, the semiconductor material of substrate semiconductor layer 10. The epitaxially deposited semiconductor material of the epitaxial semiconductor layer 30L can be selected from any semiconductor material that can be employed for the substrate semiconductor layer 10. The thickness of the epitaxial semiconductor layer 30L is less than the height of the mandrel structures 20'. The thickness of the epitaxial semiconductor layer 30L can be from 5 nm to 500 nm, although lesser and greater thicknesses can also be employed.

In selective epitaxy, the exemplary semiconductor structure can be placed in a process chamber. A reactant gas including a precursor gas for a semiconductor material is flowed into the process chamber simultaneously with, or alternately with, an etchant gas that etches a semiconductor material. The net deposition rate on the surfaces of the substrate semiconductor layer 10 is the difference between the deposition rate of a semiconductor material due to the reactant gas less the etch rate of the semiconductor material due to the etchant gas. The selective epitaxy process does not deposit any semiconductor material on the surfaces of the mandrel structures 20' by preventing nucleation of the semiconductor material thereupon. Any semiconductor material that nucleates on the dielectric surfaces is etched by the etchant gas before a contiguous layer of a deposited semiconductor material can be formed on the dielectric surfaces. The portions of the deposited semiconductor material that grow from the surface of the substrate semiconductor layer 10 can contact surfaces of the mandrel structures 20'.

The reactant gas can be, for example, $SiH_4$, $SiH_2Cl_2$, $SiHCl_3$, $SiCl_4$, $Si_2H_6$, $GeH_4$, $Ge_2H_6$, $CH_4$, $C_2H_2$, or combinations thereof. The etchant gas can be, for example, HCl. A carrier gas such as $H^2$, $N^2$, or Ar can be employed in conjunction with the reactant gas and/or the etchant gas.

Figure 3A:
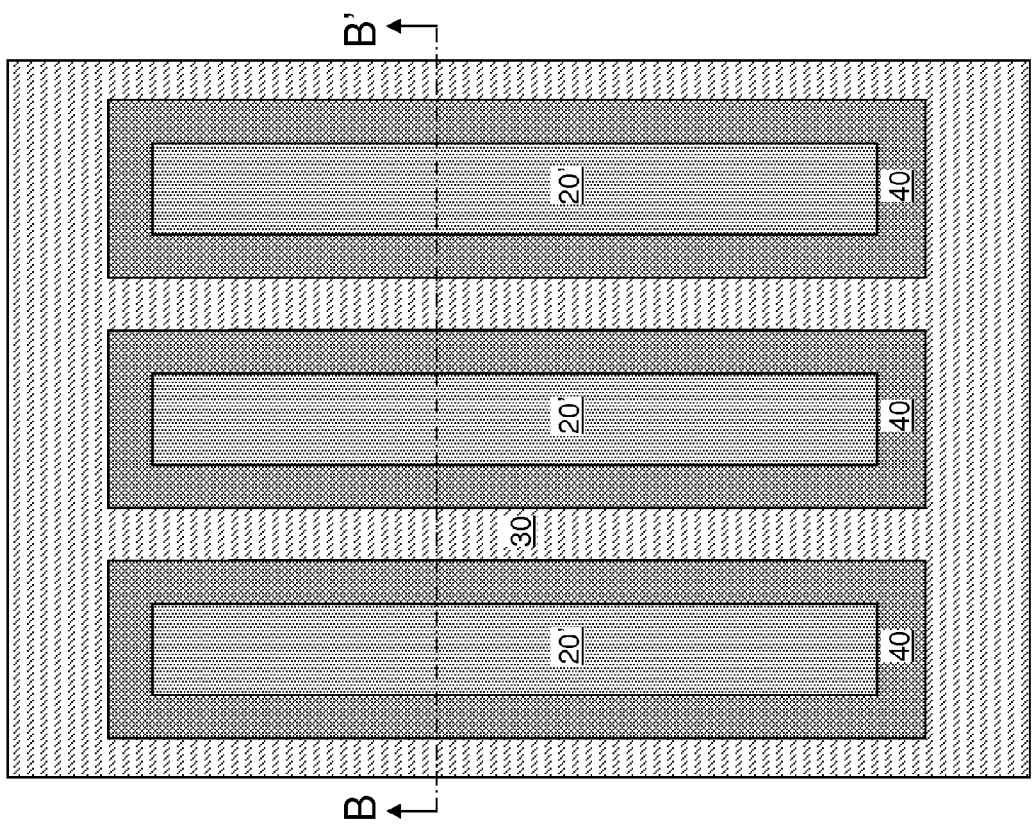
FIG. 3A is a top-down view of the exemplary semiconductor structure after formation of first dielectric spacers according to an embodiment of the present disclosure.
Figure 3B:
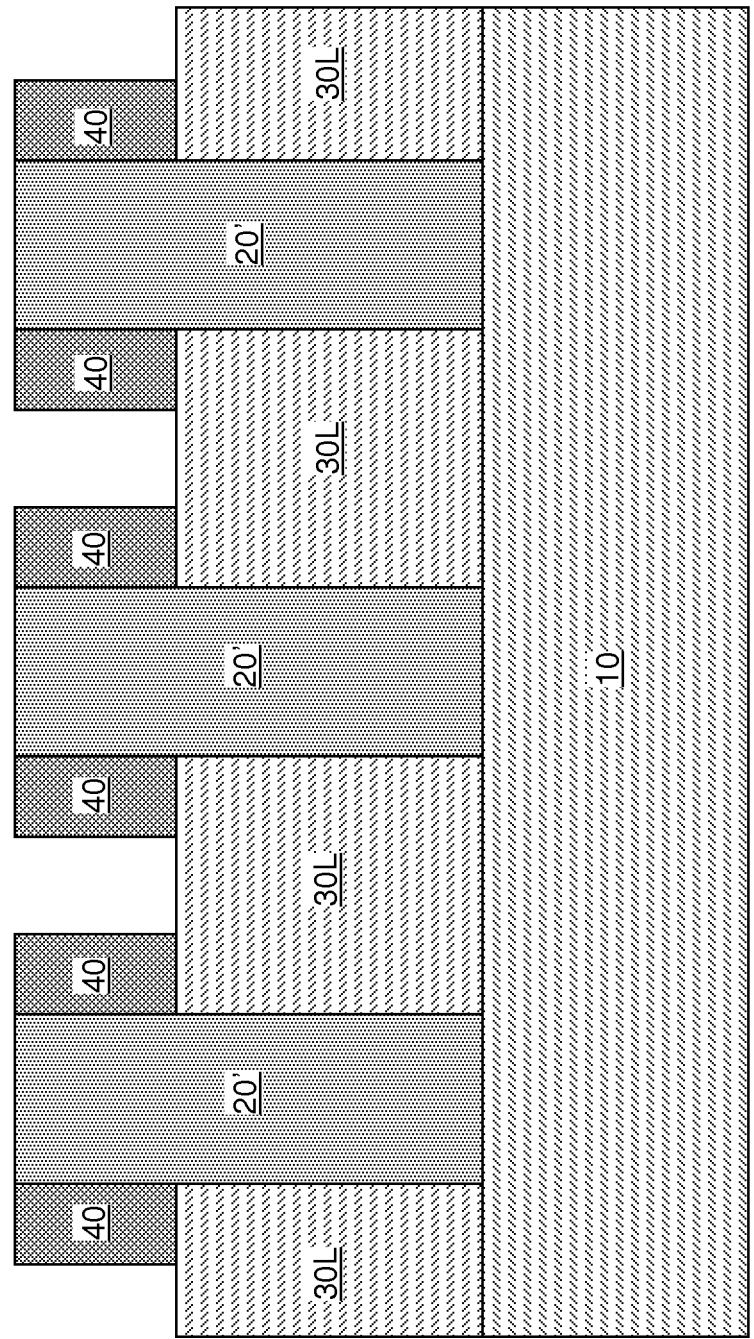
FIG. 3B is a vertical cross-sectional view of the exemplary semiconductor structure along the vertical plane B-B' of FIG. 3A.

Referring to FIGS. 3A and 3B, first dielectric spacers 40 are formed on physically exposed sidewalls of the mandrel structures 40, for example, by deposition of a dielectric material layer and an anisotropic etch that removes the horizontal portions of the dielectric material layer. The remaining vertical portions of the dielectric material layer are the first dielectric spacers 40. The first dielectric spacers 40 can include, for example, silicon oxide, silicon nitride, or organosilicate glass. In one embodiment, the first dielectric spacers 40 can include a different dielectric material than the dielectric material of the mandrel structures 20'. For example, the mandrel structures 20' can include silicon oxide, and the first dielectric spacers 40 can include silicon nitride or organosilicate glass. The width of the first dielectric spacer 40 is selected to be less than one half of the nearest distance between a pair of mandrel structures 20'. Thus, each first dielectric spacer 40 laterally surrounds an upper portion of a mandrel structure 20', and does not contact any other first dielectric spacer 40.

Figure 4:
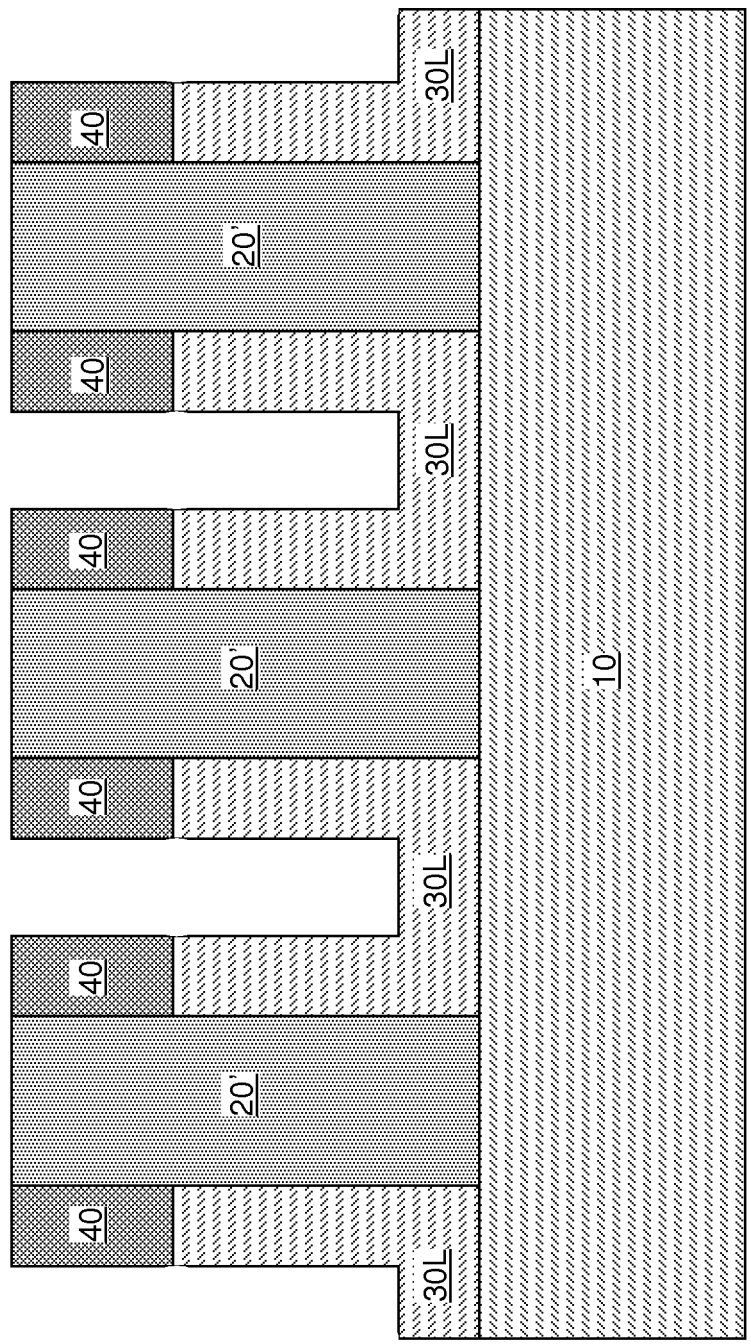
FIG. 4 is a vertical cross-sectional view of the exemplary semiconductor structure after recessing physically exposed portions of the epitaxial semiconductor layer according to an embodiment of the present disclosure.

Referring to FIG. 4, the physically exposed portions of the epitaxial semiconductor layer 30L are vertically recessed by an anisotropic etch, which removes the semiconductor material of the epitaxial semiconductor layer 30L selective to the dielectric materials of the mandrel structures 20' and the first dielectric spacers 40. The first dielectric spacers 40 are employed as an etch mask during the anisotropic etching of the physically exposed portions of the epitaxial semiconductor layer 30L. The depth of the recessed regions in the epitaxial semiconductor layer 30L is less than the thickness of the epitaxial semiconductor layer 30L as deposited. The outer sidewalls of the first dielectric spacers 40 and the physically exposed sidewalls of the epitaxial semiconductor layer 30L can be vertically coincident with each other. As used herein, two surfaces are "vertically coincident" if the two surfaces are within a same vertical plane.

Figure 5:
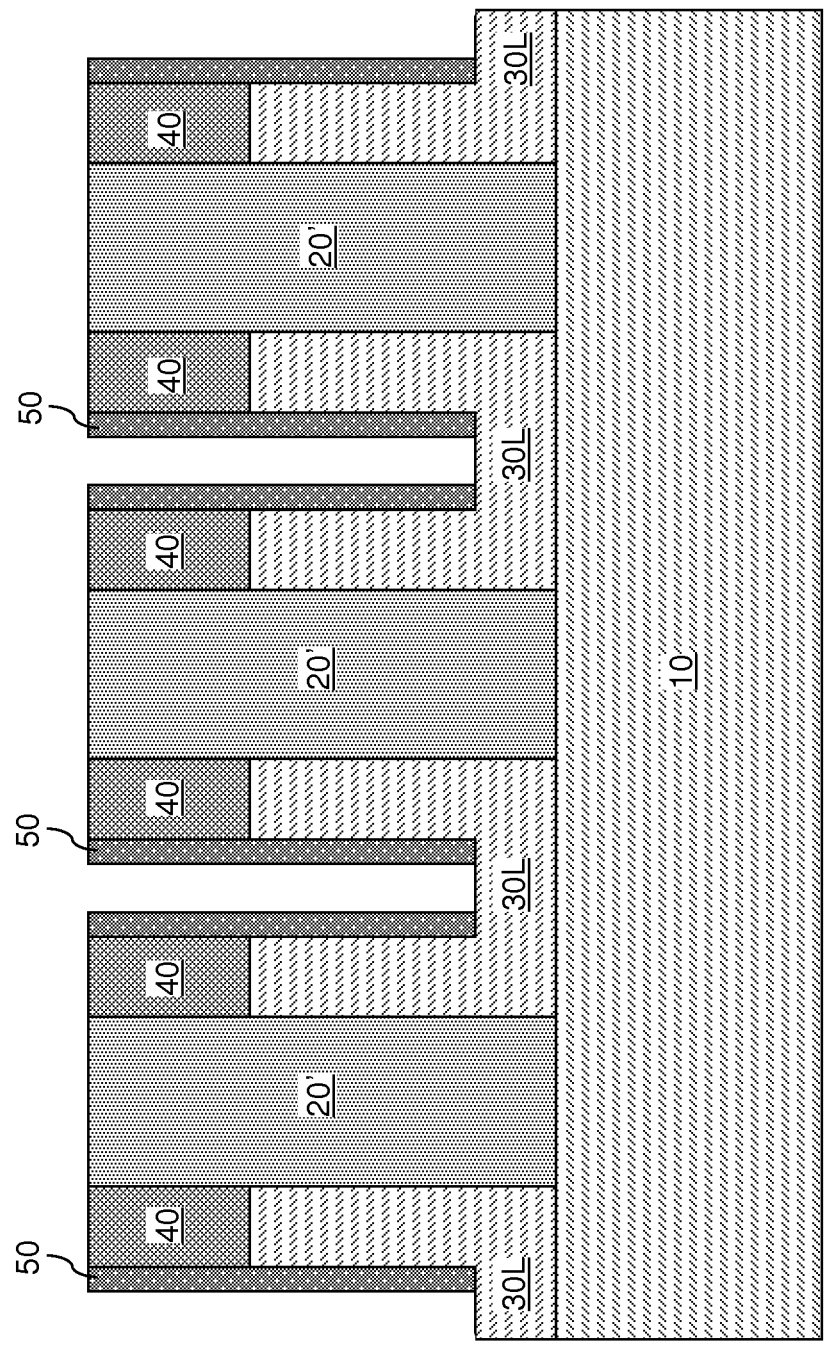
FIG. 5 is a vertical cross-sectional view of the exemplary semiconductor structure after formation of second dielectric spacers according to an embodiment of the present disclosure.

Referring to FIG. 5, second dielectric spacers 50 are formed on outer sidewalls of the first dielectric spacers 40 and the physically exposed sidewalls of the epitaxial semiconductor layer 30L, for example, by deposition of a dielectric material layer and an anisotropic etch that removes the horizontal portions of the dielectric material layer. The remaining vertical portions of the dielectric material layer are the second dielectric spacers 50. The second dielectric spacers 50 can include, for example, silicon oxide, silicon nitride, or organosilicate glass. In one embodiment, the second dielectric spacers 50 can include a different dielectric material than the dielectric material of the mandrel structures 20'. For example, the mandrel structures 20' can include silicon oxide, and the first dielectric spacers 40 and the second dielectric spacers 50 can include silicon nitride and/or silicon nitride. The width of the second dielectric spacer 50 is selected to be less than one half of the narrowest recessed region in the epitaxial semiconductor layer 30L. Thus, each second dielectric spacer 50 laterally surrounds a first dielectric spacer 40 and a contiguous upper portion of the epitaxial semiconductor layer 30L, and does not contact any other second dielectric spacer 50.

Figure 6:
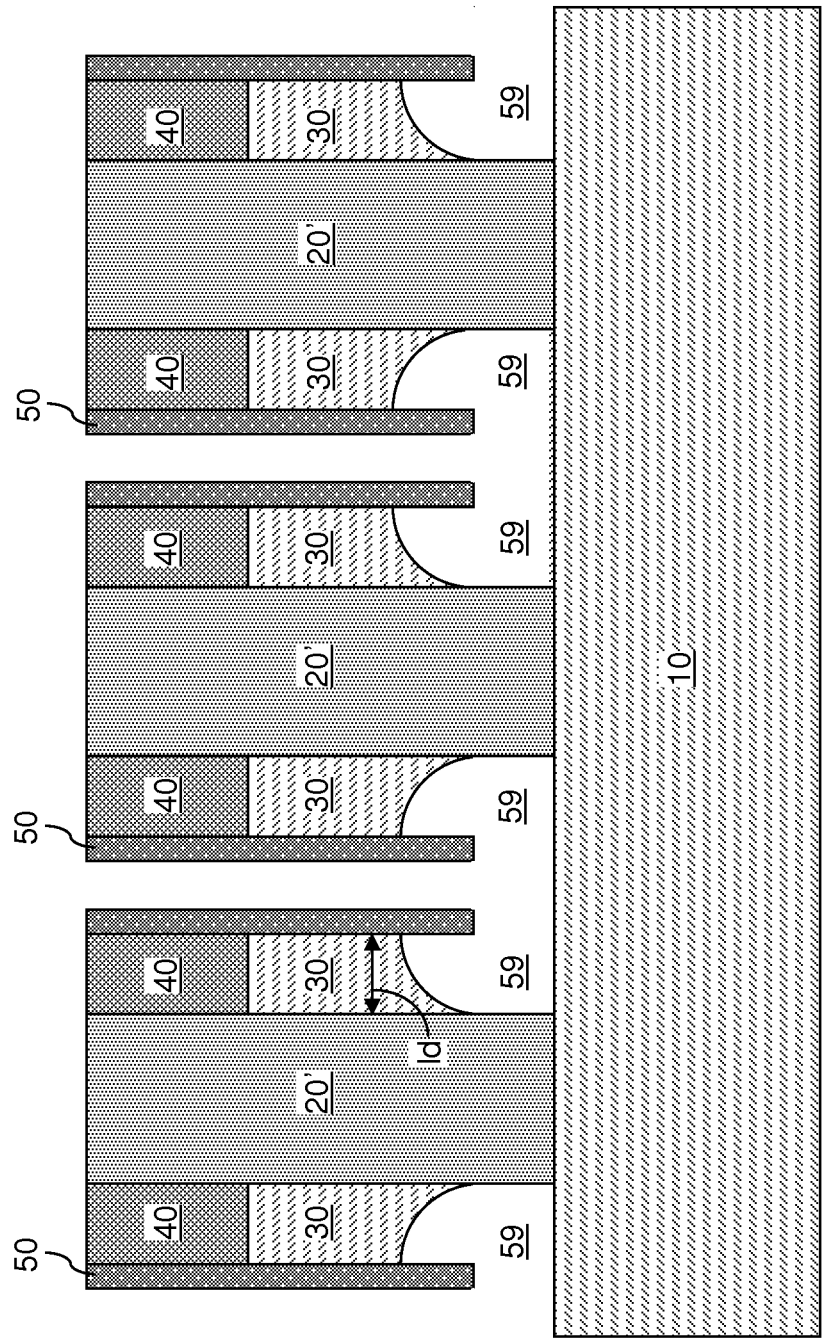
FIG. 6 is a vertical cross-sectional view of the exemplary semiconductor structure after formation of ring-shaped semiconductor nanowires according to an embodiment of the present disclosure.

Referring to FIG. 6, the epitaxial semiconductor layer 30L is isotropically etched to form ring-shaped semiconductor nanowires 30. The isotropic etch of portions of the epitaxial semiconductor layer 30L can be performed by a wet etch or an isotropic dry etch such as chemical downstream etch as known in the art. The chemistry of the isotropic etch can be selected such that the first and second dielectric spacers (40, 50) are not etched during the isotropic etch. Further, the chemistry of the isotropic etch can be selected such that the mandrel structures 20' are not etched during the isotropic etch. For example, the epitaxial semiconductor layer 30L can be etched in a process chamber at an elevated temperature (at about 800° C.) employing HCl as an etchant gas, or employing wet etch chemistries that remove the semiconductor material of the epitaxial semiconductor layer 30L selective to the dielectric material(s) of the first and second dielectric spacers (40, 50) and optionally selective to the dielectric material of the mandrel structures 20'.

Each ring-shaped semiconductor nanowire 30 can have a lateral dimension ld that is the same as the width of the first dielectric spacers 40. For example, the lateral dimension ld across a portion of a ring-shaped semiconductor nanowire 30 can be from 1 nm to 100 nm, although lesser and greater lateral dimensions can also be employed. Each ring-shaped semiconductor nanowire 30 laterally surrounds a mandrel structure 20', and is topologically homeomorphic to a torus, i.e., may be contiguously stretched into a torus without creating or eliminating any new hole therein. An undercut region 59 is formed underneath each ring-shaped semiconductor nanowire 30. Each ring-shaped semiconductor nanowire 30 includes a parallel pair of inner vertical sidewalls and a parallel pair of outer vertical sidewalls that are parallel among one another and extends along the direction of the mandrel structure length lm (See FIG. 1A).

In one embodiment, the epitaxial semiconductor layer 30L can be etched from the recessed portions thereof by etching a semiconductor material of the epitaxial semiconductor layer 30L selective to the semiconductor material of the substrate semiconductor layer 10, which can be the same as, or different from, the semiconductor material of the epitaxial semiconductor layer 30L. In one embodiment, the substrate semiconductor layer 10 can include silicon, and the epitaxial semiconductor layer 30L can include a silicon-germanium alloy, and the etch chemistry (such as hydrogen-peroxide based etch chemistry) can be selected to remove the silicon-germanium alloy without significantly etching silicon.

Figure 7A:
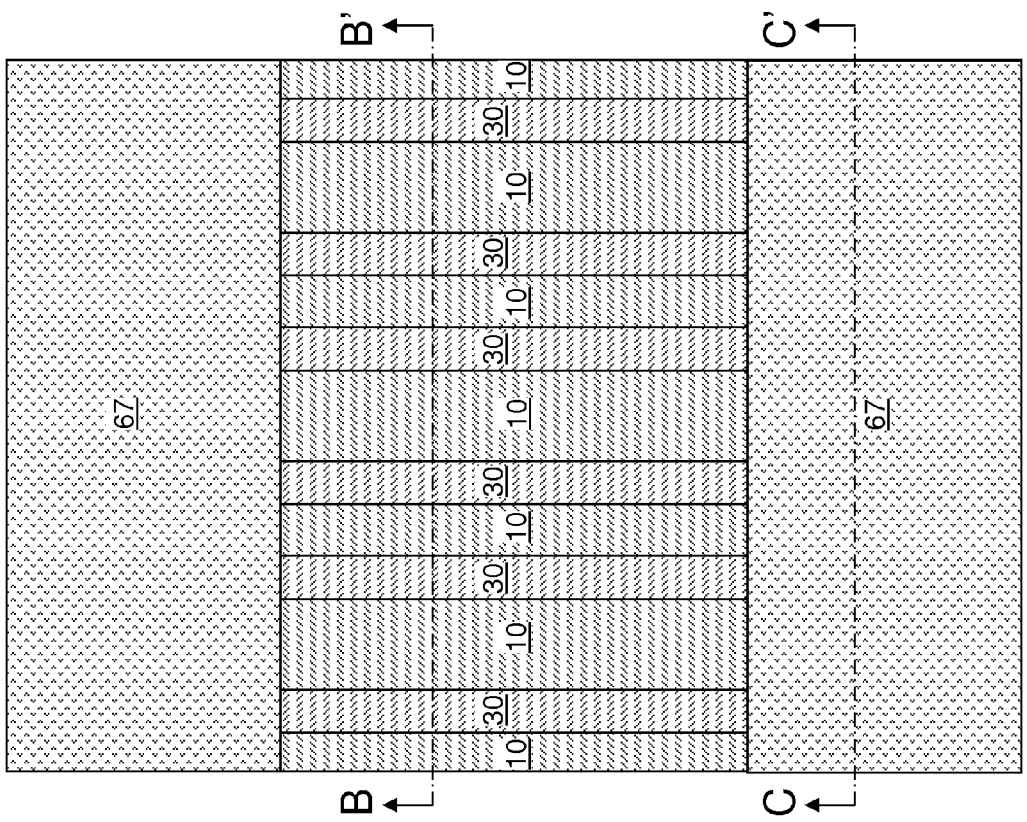
FIG. 7A is a top-down view of the exemplary semiconductor structure after formation of a patterned mask layer and etching of physically exposed portions of the first and second dielectric spacers and the mandrels according to an embodiment of the present disclosure.
Figure 7B:
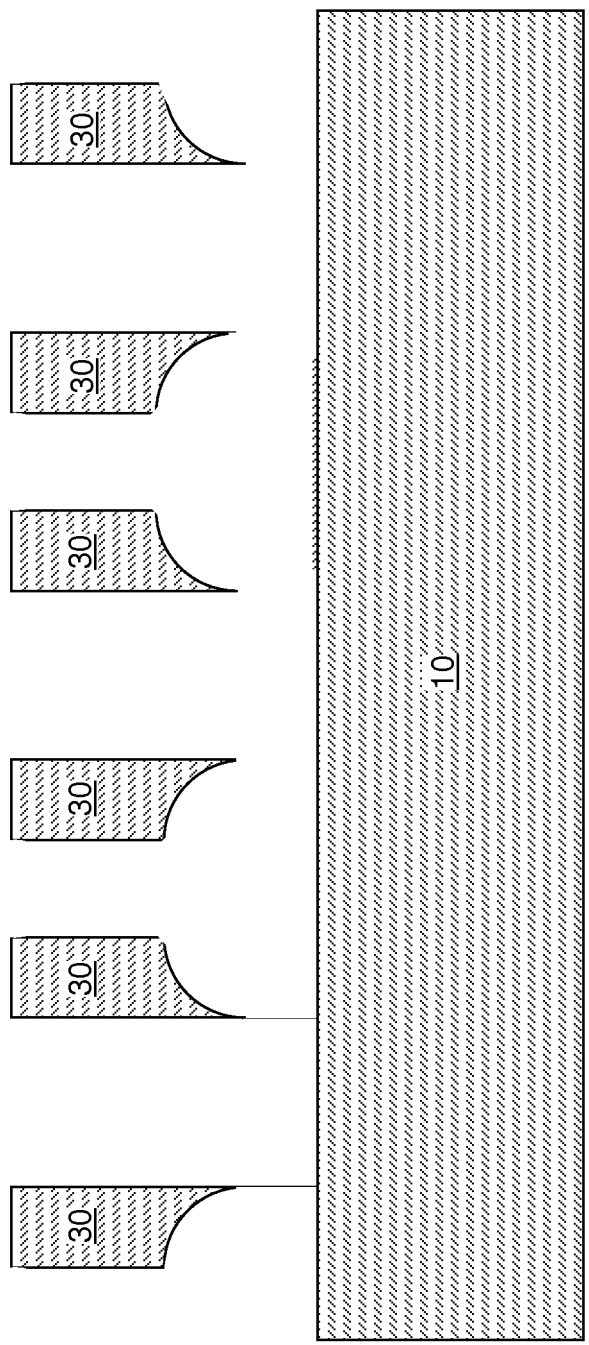
FIG. 7B is a vertical cross-sectional view of the exemplary semiconductor structure along the vertical plane B-B' of FIG. 7A.
Figure 7C:
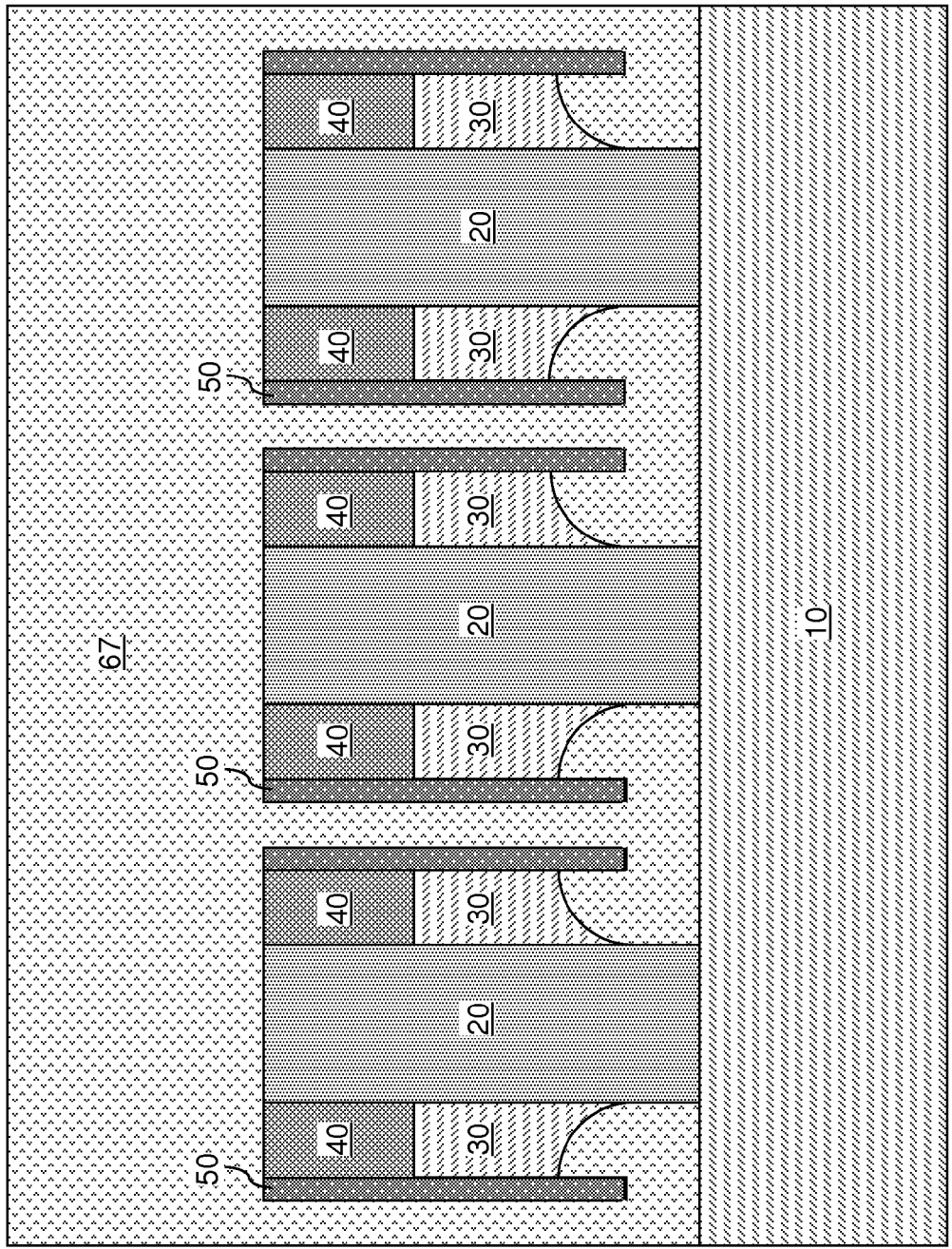
FIG. 7C is a vertical cross-sectional view of the exemplary semiconductor structure along the vertical plane C-C' of FIG. 7A.

Referring to FIGS. 7A-7C, the mandrel structures 20' are patterned by covering end portions of each mandrel structure 20' with a patterned mask layer 67, while physically exposing a portion of each mandrel structure 20' between the end portions, and by removing the physically exposed portion of the mandrel structure 20'. For example, a patterned mask layer 67 can be formed over the mandrel structures 20', the first and second dielectric spacers (40, 50), and the ring-shaped semiconductor nanowires 30. The patterned mask layer 67 can be, for example, a patterned photoresist layer, which can be formed by applying and lithographically patterning a photoresist material.

The patterned mask layer 67 covers two end portions of each assembly of a mandrel structure 20', a first dielectric spacer 40, a second dielectric spacer 50, and a ring-shaped semiconductor nanowire 30. A center portion of each assembly of a mandrel structure 20', a first dielectric spacer 40, a second dielectric spacer 50, and a ring-shaped semiconductor nanowire 30 is not covered by the patterned mask layer 67.

At least one etch is employed to remove the portions of the first and second dielectric spacers (40, 50) and the portions of the mandrel structures 20' that are not covered by the patterned mask layer 67. The at least one etch can include a wet etch and/or a dry etch. The patterned mask layer 67 is employed as the etch mask during the at least one etch. If the first and second dielectric spacers (40, 50) and the portions of the mandrel structures 20' include silicon oxide, a wet etch employing hydrofluoric acid may be employed. If the first and second dielectric spacers (40, 50) and the portions of the mandrel structures 20' include silicon oxide, a wet etch employing hot phosphoric acid may be employed.

A pair of support structures 20 is formed from remaining portions of each mandrel structure 20' by patterning the mandrel structures by the at least one etch. Two portions of each ring-shaped semiconductor nanowire 30 become suspended over the substrate semiconductor layer 10 by a pair of support structures 20.

Referring to FIGS. 8A-8D, the patterned mask layer 67 can be subsequently removed, for example, by ashing. The exemplary semiconductor structure includes, among others, a pair of support structures 20 located on the substrate semiconductor layer 10, and a ring-shaped semiconductor nanowire 30 vertically spaced from the substrate semiconductor layer 10 and contacting outer sidewall surfaces of the pair of support structures 20.

Two portions of the ring-shaped semiconductor nanowire 30 do not contact the pair of support structures 20. The two portions of the ring-shaped semiconductor nanowire 20 laterally extend along a direction parallel to a line 201 connecting a geometrical center of one of the pair of support structures 20 to a geometrical center of another of the pair of support structures 20. In one embodiment, the two portions of each ring-shaped semiconductor nanowire 30 can be laterally spaced by a uniform separation distance sd therebetween.

A pair of first dielectric spacers 40 is present on each ring-shaped semiconductor nanowire 30. The pair of first dielectric spacers 40 is remaining portions of a single dielectric spacer 40 prior to the at least one etch at the processing steps of FIGS. 7A-7C. Each of the pair of first dielectric spacers 40 is in contact with sidewalls of one of the pair of support structures 20 and a planar top surface of the ring-shaped semiconductor nanowire 30. In one embodiment, each inner sidewall of the pair of first dielectric spacers 40 can be vertically coincident with an interface between the ring-shaped semiconductor nanowire 30 and the pair of support structures 20.

A pair of second dielectric spacers 50 is present on each ring-shaped semiconductor nanowire 30. Each of the pair of second dielectric spacers 50 is in contact with sidewalls of one of the pair of first dielectric spacers 40 and vertical sidewalls of the ring-shaped semiconductor nanowire 20. Each interface between the pair of first dielectric spacers 40 and the pair of second dielectric spacers 50 can be vertically coincident with an interface between the ring-shaped semiconductor nanowire 30 and the pair of second dielectric spacers 50. A bottom surface of the pair of second dielectric spacers 50 can be more proximal to the substrate semiconductor layer 10 than a bottommost surface of the ring-shaped semiconductor nanowire 30.

Referring to FIGS. 9A-9D, the exemplary semiconductor structure can be optionally annealed at an elevated temperature to round physically exposed corners of the ring-shaped semiconductor nanowires 30. As used herein, to "round" refers to converting at least one angled corner into a surface that does not include an angle.

In one embodiment, the two suspended portions of the ring-shaped semiconductor nanowire 30 can have substantially elliptical vertical cross-sectional areas. As used herein, a shape is "elliptical" if the shape is a conical cross-sectional shape, i.e., a shape that can be obtained by taking a cross-sectional shape of a cone. As used herein, a shape is "substantially elliptical" if the shape of the surface can be approximated by an ellipse with lesser residual area after fitting that with a rectangle.

The anneal at an elevated temperature can be performed in a hydrogen ambient at a temperature selected from a range from 900° C. to 1,300° C., although lesser and greater temperatures can also be employed.

Figure 10A:
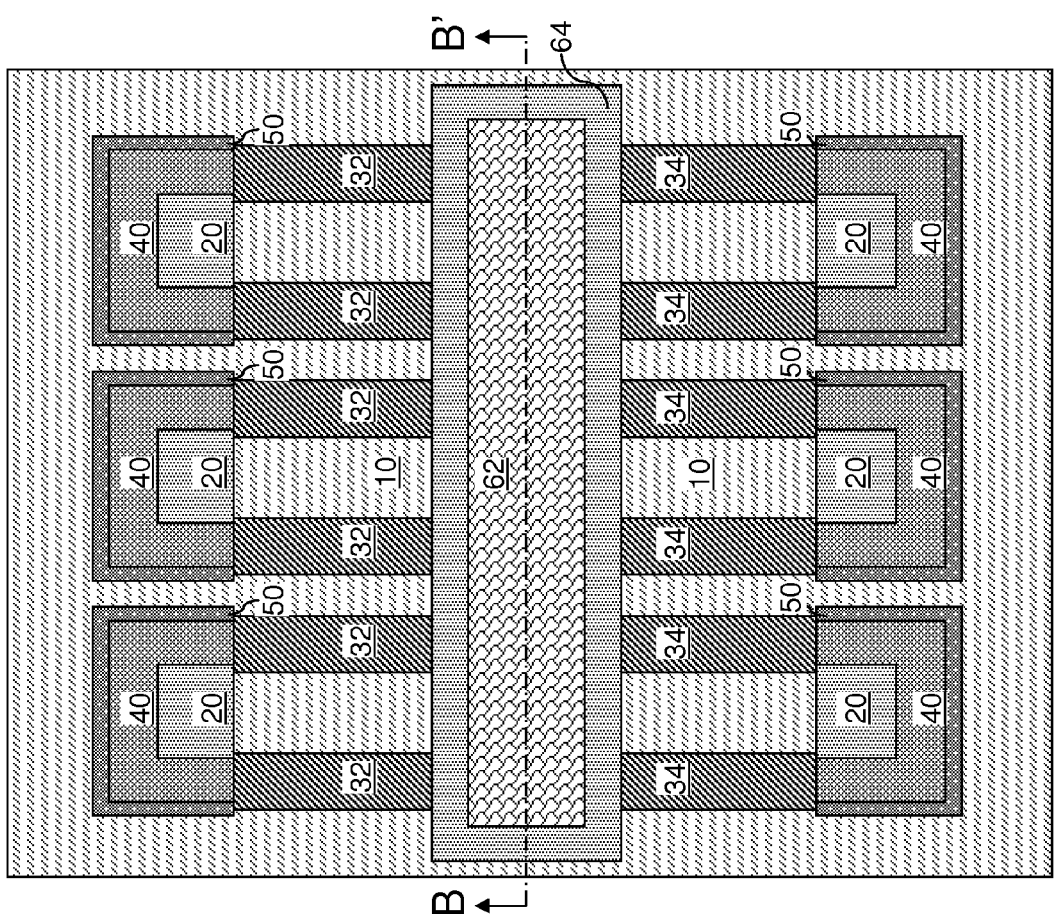
FIG. 10A is a top-down view of the exemplary semiconductor structure after formation of a gate dielectric, a gate electrode, and a gate spacer according to an embodiment of the present disclosure.
Figure 10B:
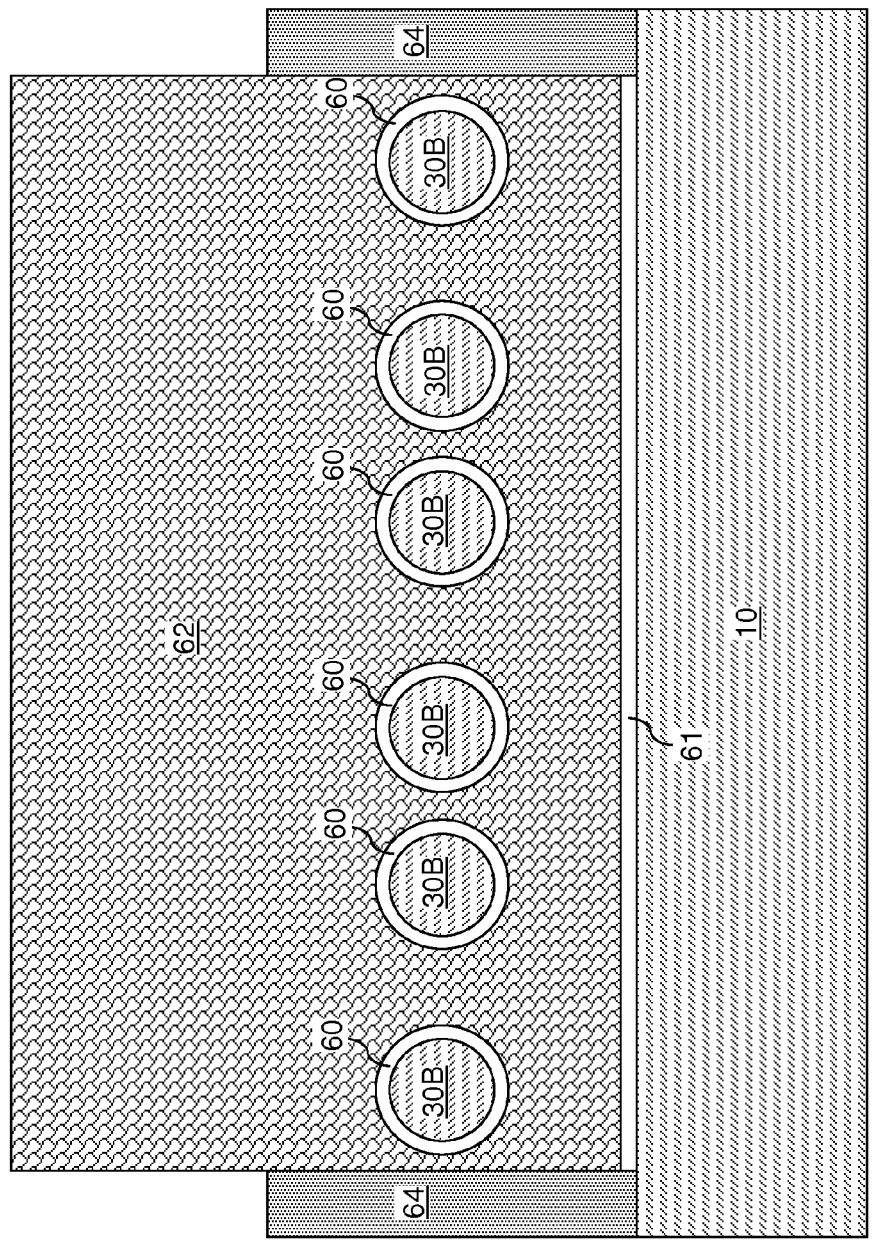
FIG. 10B is a vertical cross-sectional view of the exemplary semiconductor structure along the vertical plane B-B' of FIG. 10A.
Figure 10C:
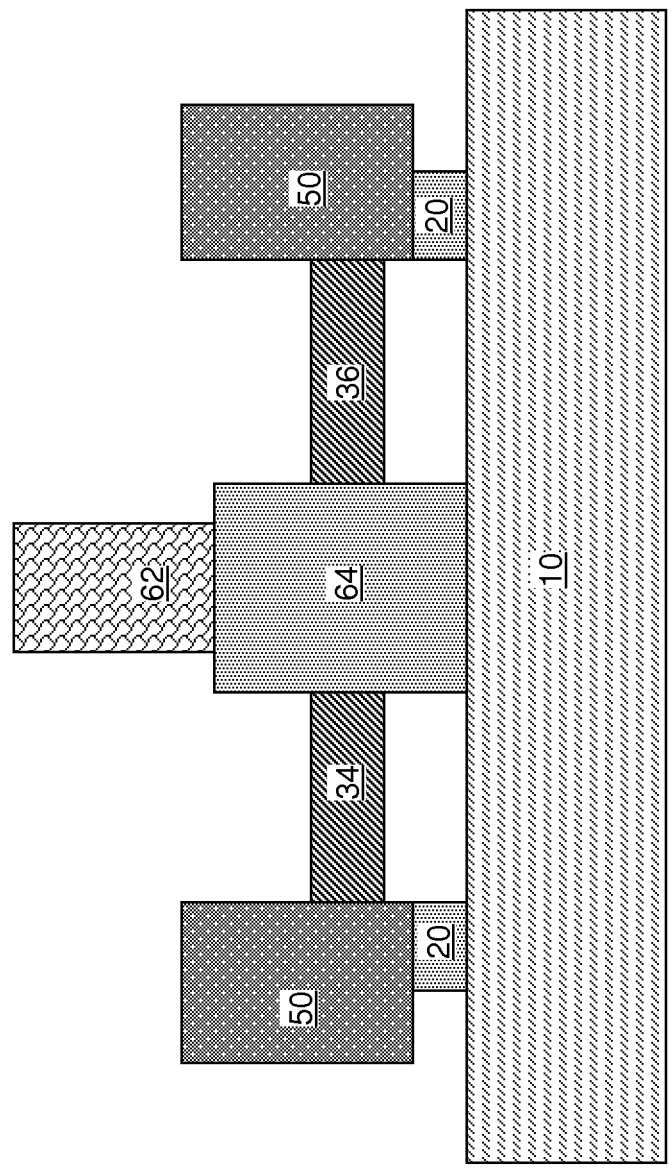
FIG. 10C is a side view of the exemplary semiconductor structure along the horizontal direction parallel to the vertical planes B-B' of FIG. 9A.
Figure 11A:
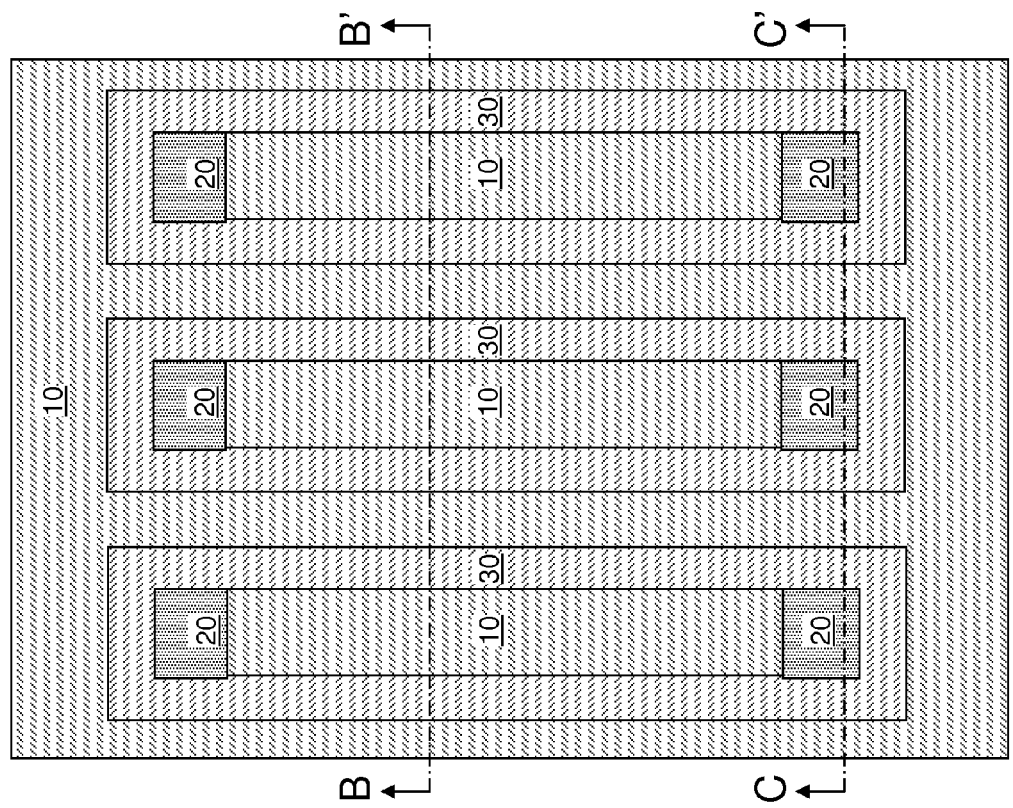
FIG. 11A is a top-down view of a first variation of the exemplary semiconductor structure after removal of the first and second dielectric spacers according to an embodiment of the present disclosure.
Figure 11B:
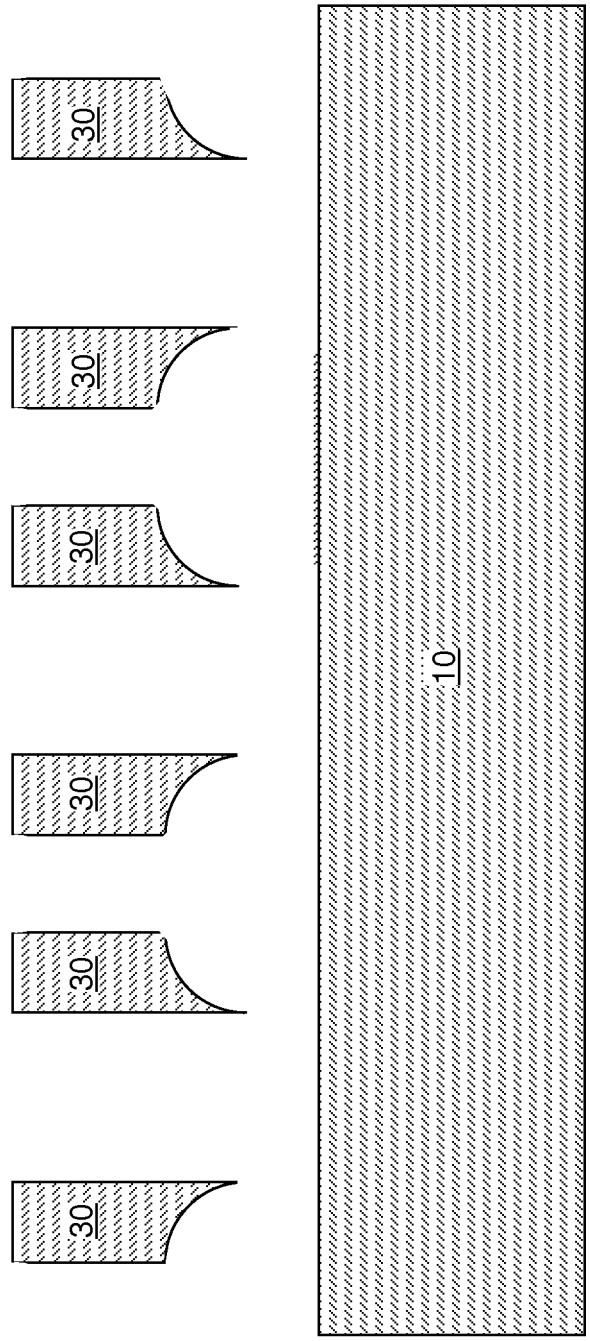
FIG. 11B is a vertical cross-sectional view of the first variation of exemplary semiconductor structure along the vertical plane B-B' of FIG. 11A.
Figure 11C:
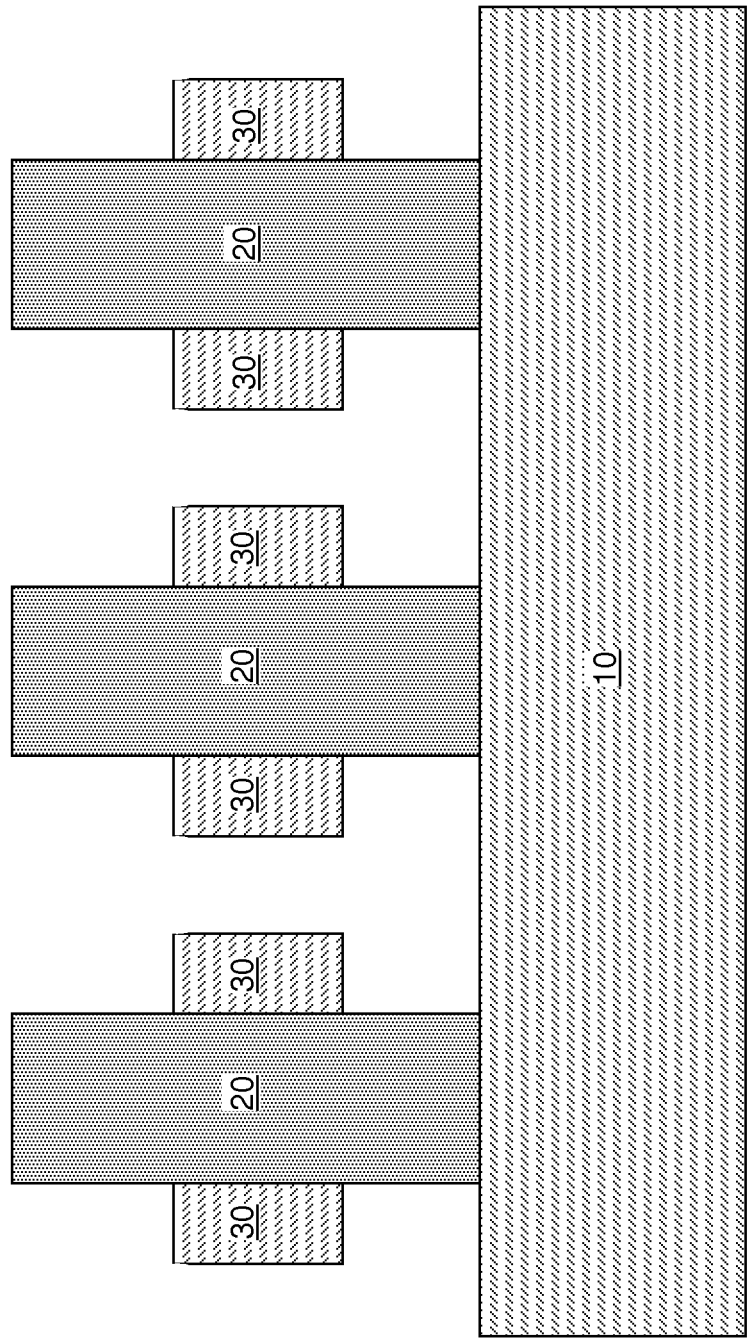
FIG. 11C is a vertical cross-sectional view of the first variation of the exemplary semiconductor structure along the vertical plane C-C' of FIG. 11A.
Figure 11D:
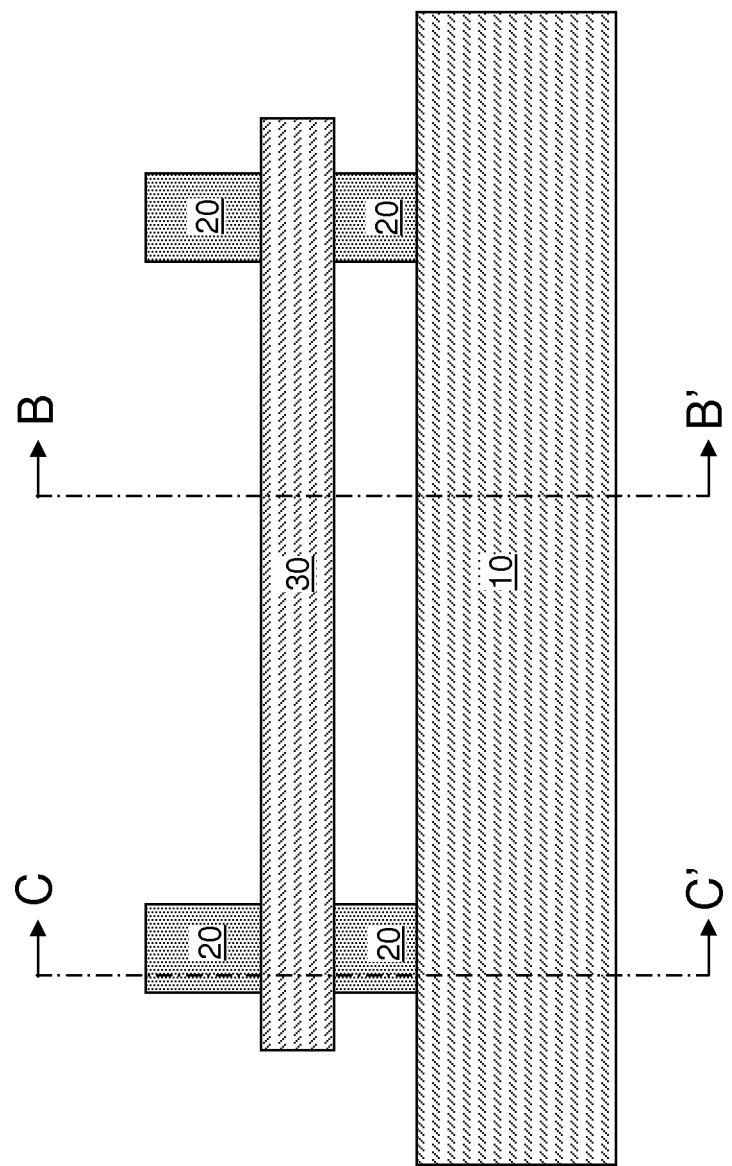
FIG. 11D is a side view of the first variation of the exemplary semiconductor structure along the horizontal direction parallel to the vertical planes B-B' and C-C' of FIG. 11A.

Referring to FIGS. 10A-10C, a gate dielectric 60, a gate electrode 62, and a gate spacer 64 can be formed on suspended portions of the ring-shaped semiconductor nanowires 30. The gate dielectric 60 and the gate electrode 62 can straddle over the two suspended portions of each ring-shaped semiconductor nanowire 30.

In one embodiment, the gate dielectric 60 can be formed, for example, by conversion of surface portions of the ring-shaped semiconductor nanowires 30. A dielectric material layer 61 can be formed concurrently with formation of the gate dielectric 60. Alternately or additionally, the gate dielectric 60 can be formed by deposition of a dielectric material around the suspended portions of the ring-shaped semiconductor nanowires 30. The gate electrode 62 can include any conductive material as known in the art. The gate dielectric 60 and the gate electrode 62 can be patterned, for example, by forming a patterned photoresist layer thereupon, and by transferring the pattern in the patterned photoresist layer into an underlying material stack by an anisotropic etch.

The gate spacer 64 can be formed, for example, by deposition of a dielectric material layer and an anisotropic etch that removes horizontal portions of the dielectric material layer. The remaining portion of the dielectric material layer after the anisotropic etch constitutes the gate spacer 64.

Dopants can be implanted into the portions of the ring-shaped semiconductor nanowires 30 between the gate spacer 64 and the support structures 20 to form source regions 32 and drain regions 34 of a field effect transistor. Unimplanted portions of the ring-shaped semiconductor nanowires 30 laterally surrounded by the gate electrode 62 constitute the body regions 30B of the field effect transistor. Optionally, selective epitaxy can be performed to form raised source regions (not shown) on the source regions 32 and raised drain regions (not shown) on the drain regions 34.

Figure 8A:
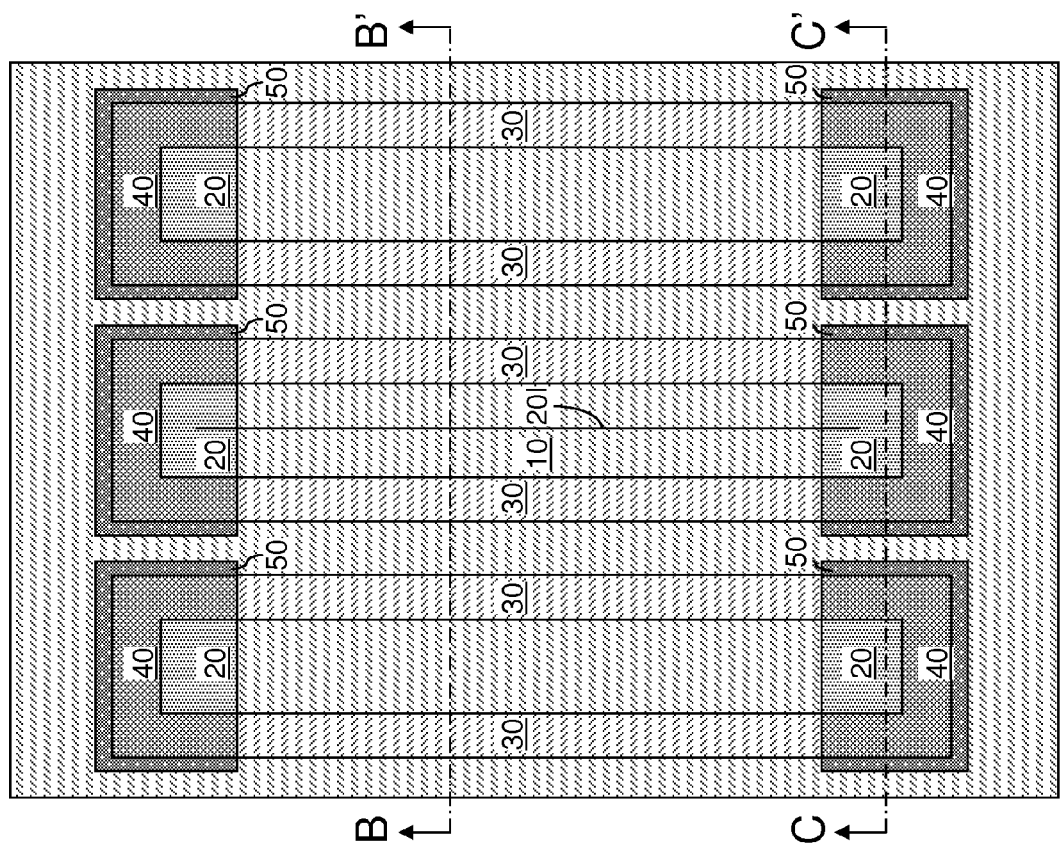
FIG. 8A is a top-down view of the exemplary semiconductor structure after removal of a patterned mask layer according to an embodiment of the present disclosure.
Figure 8C:
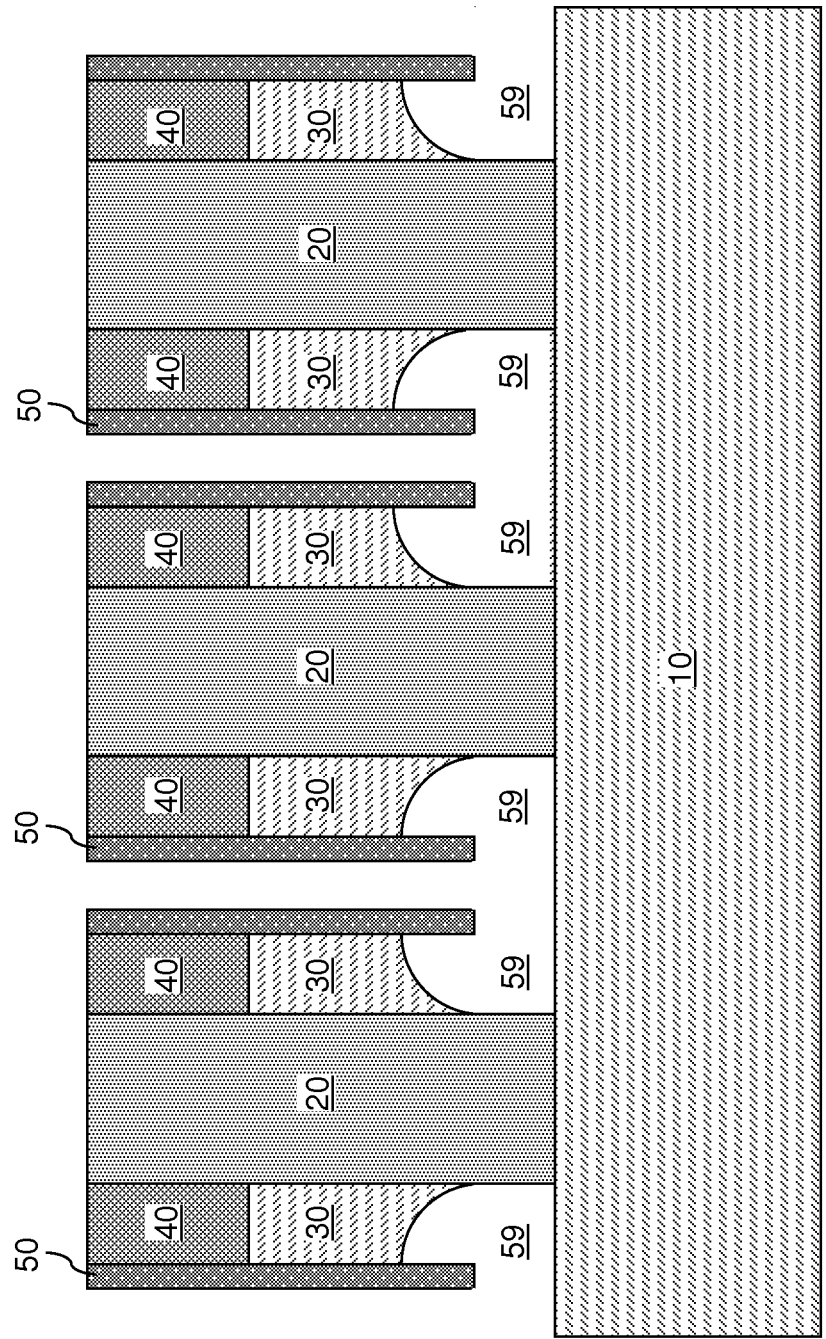
FIG. 8C is a vertical cross-sectional view of the exemplary semiconductor structure along the vertical plane C-C' of FIG. 8A.
Figure 8D:
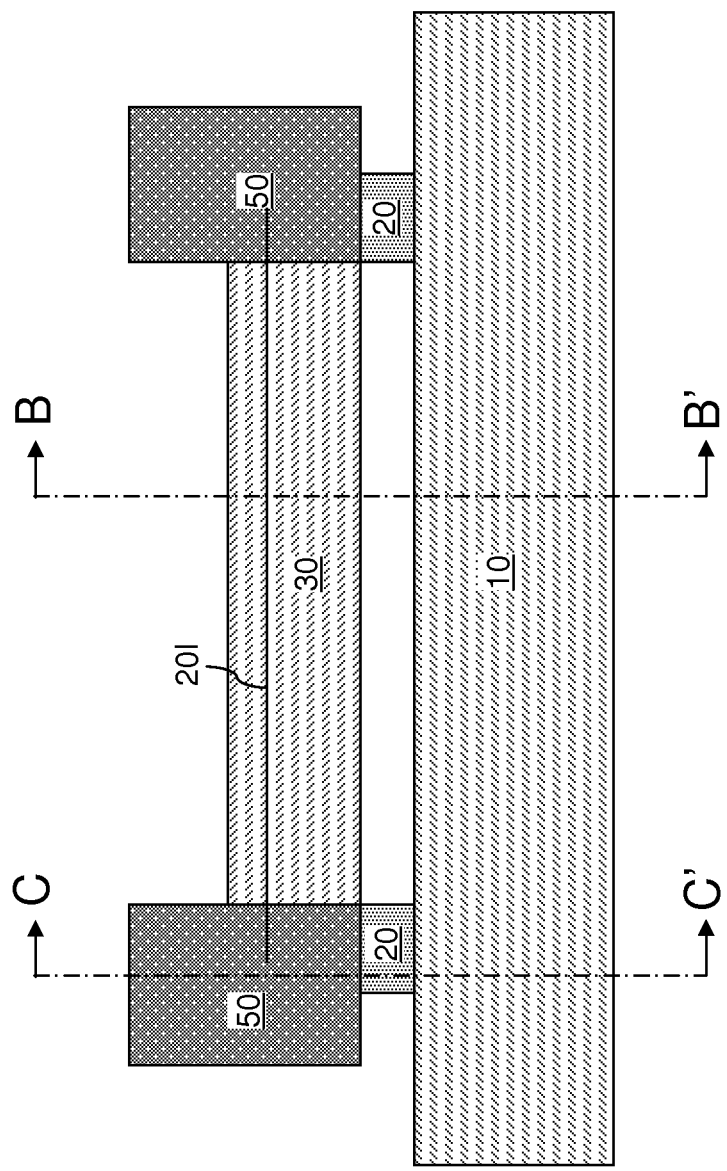
FIG. 8D is a side view of the exemplary semiconductor structure along the horizontal direction parallel to the vertical planes B-B' and C-C' of FIG. 8A.
Figure 9A:
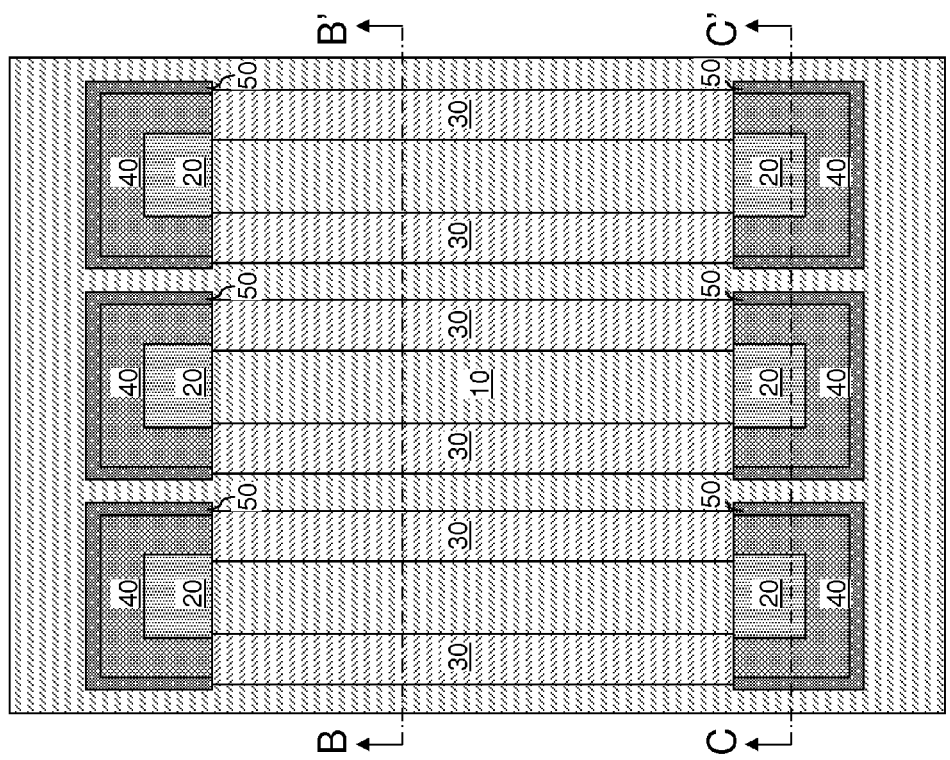
FIG. 9A is a top-down view of the exemplary semiconductor structure after rounding physically exposed corners of the ring-shaped semiconductor nanowires according to an embodiment of the present disclosure.
Figure 9B:
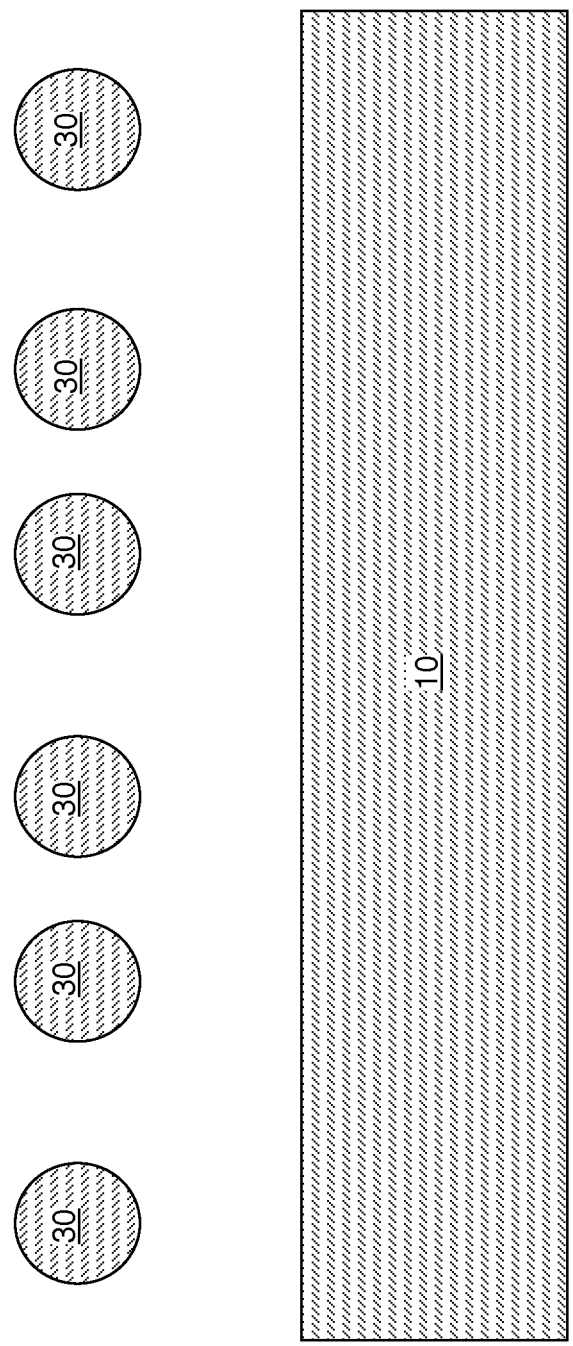
FIG. 9B is a vertical cross-sectional view of the exemplary semiconductor structure along the vertical plane B-B' of FIG. 9A.
Figure 9C:
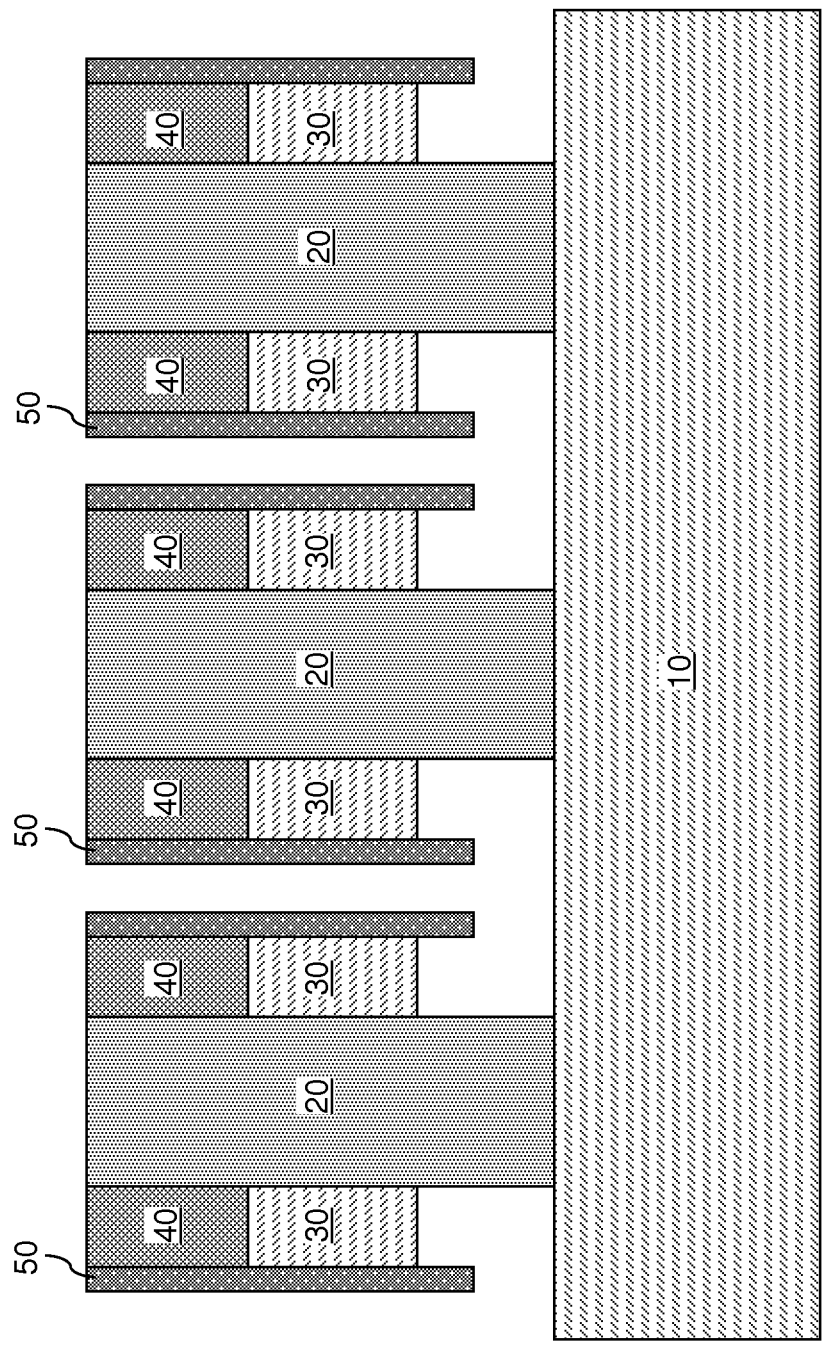
FIG. 9C is a vertical cross-sectional view of the exemplary semiconductor structure along the vertical plane C-C' of FIG. 9A.
Figure 9D:
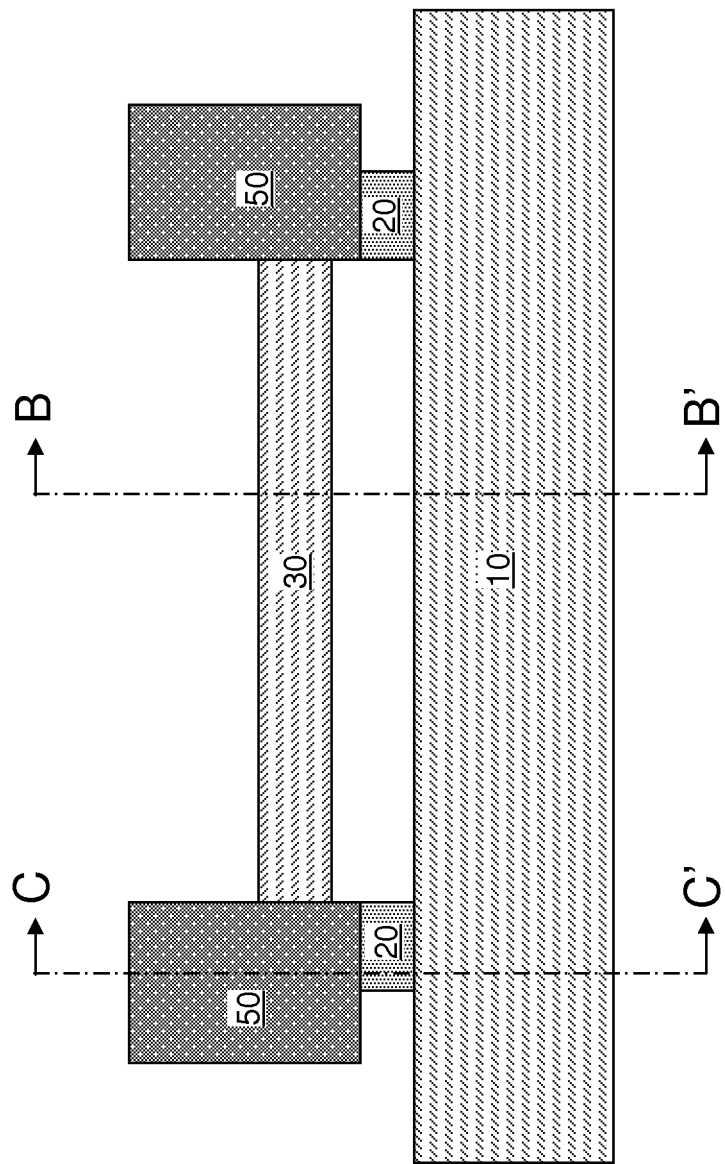
FIG. 9D is a side view of the exemplary semiconductor structure along the horizontal direction parallel to the vertical planes B-B' and C-C' of FIG. 9A.

Referring to FIGS. 11A-11D, a first variation of the exemplary semiconductor structure can be derived from the exemplary semiconductor structure of FIGS. 8A-8C by removing the first and second dielectric spacers (40, 50) selective to the support structures 20 and the ring-shaped semiconductor nanowires 30. The removal of the first and second dielectric spacers (40, 50) selective to the support structures 20 and the ring-shaped semiconductor nanowires 30 can be performed by at least one etch, which can be a wet etch. For example, if the first and/or second dielectric spacers (40, 50) include silicon nitride, and if the support structures 20 include silicon oxide, a wet etch employing hot phosphoric acid can be employed. If the first and/or second dielectric spacers (40, 50) include organosilicate glass, and if the support structures 20 include silicon oxide, a wet etch employing an etch chemistry that removes organosilicate glass faster than silicon oxide can be employed. Thus, all portions of the first dielectric spacer 40 and the second dielectric spacer 50 can be removed selective to the ring-shaped semiconductor nanowire 30. Upon removal of the first dielectric spacer 40 and the second dielectric spacer 50, top portions of the support structures 20 protrude above a horizontal plane including the topmost surfaces of the ring-shaped semiconductor nanowires 30.

Subsequently, the processing steps of FIGS. 9A-9D may be optionally performed. Further, the processing steps of FIGS. 10A-10C can be performed to form a field effect transistor.

Figure 12:
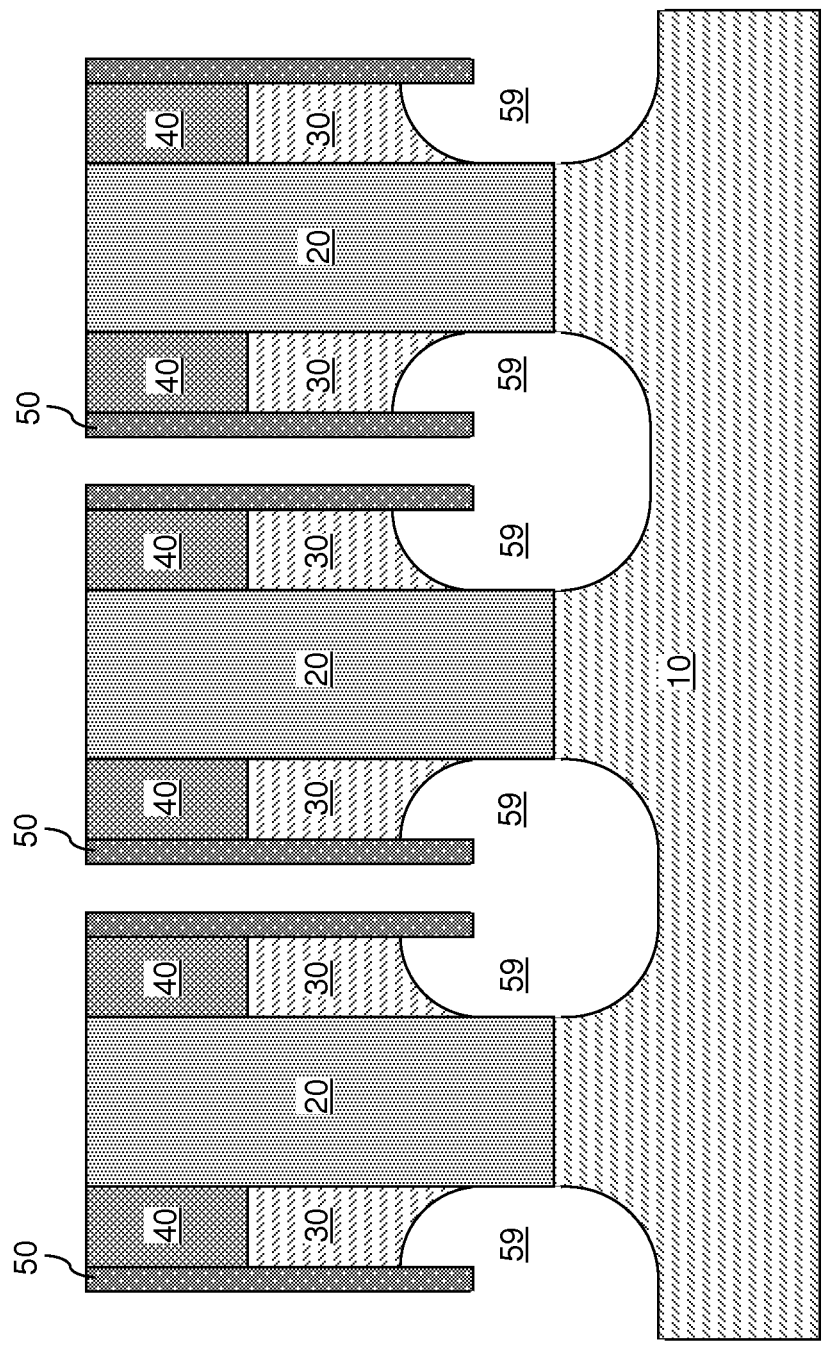
FIG. 12 is a vertical cross-sectional view of a second variation of the exemplary semiconductor structure after formation of ring-shaped semiconductor nanowires by an isotropic etch according to an embodiment of the present disclosure.

Referring to FIG. 12, a second variation of the exemplary semiconductor structure can be derived from the exemplary semiconductor structure of FIG. 5 by an isotropic etch that etches the semiconductor material of the epitaxial semiconductor material layer 30L without significant selectivity to the semiconductor material of the substrate semiconductor layer 10. In one embodiment, the epitaxial semiconductor material layer 30L and the substrate semiconductor layer 10 have the same semiconductor material, and the isotropic etch does not have any selectivity between the material of the epitaxial semiconductor material layer 30L and the material of the substrate semiconductor layer 10. In another embodiment, the epitaxial semiconductor material layer 30L and the substrate semiconductor layer 10 have different semiconductor materials, and the etch chemistry may not be significantly selective to the semiconductor material of the substrate semiconductor layer 10. The semiconductor material of the substrate semiconductor layer 10 is etched to form recessed regions on the surface of the substrate semiconductor layer 10.

Figure 13:
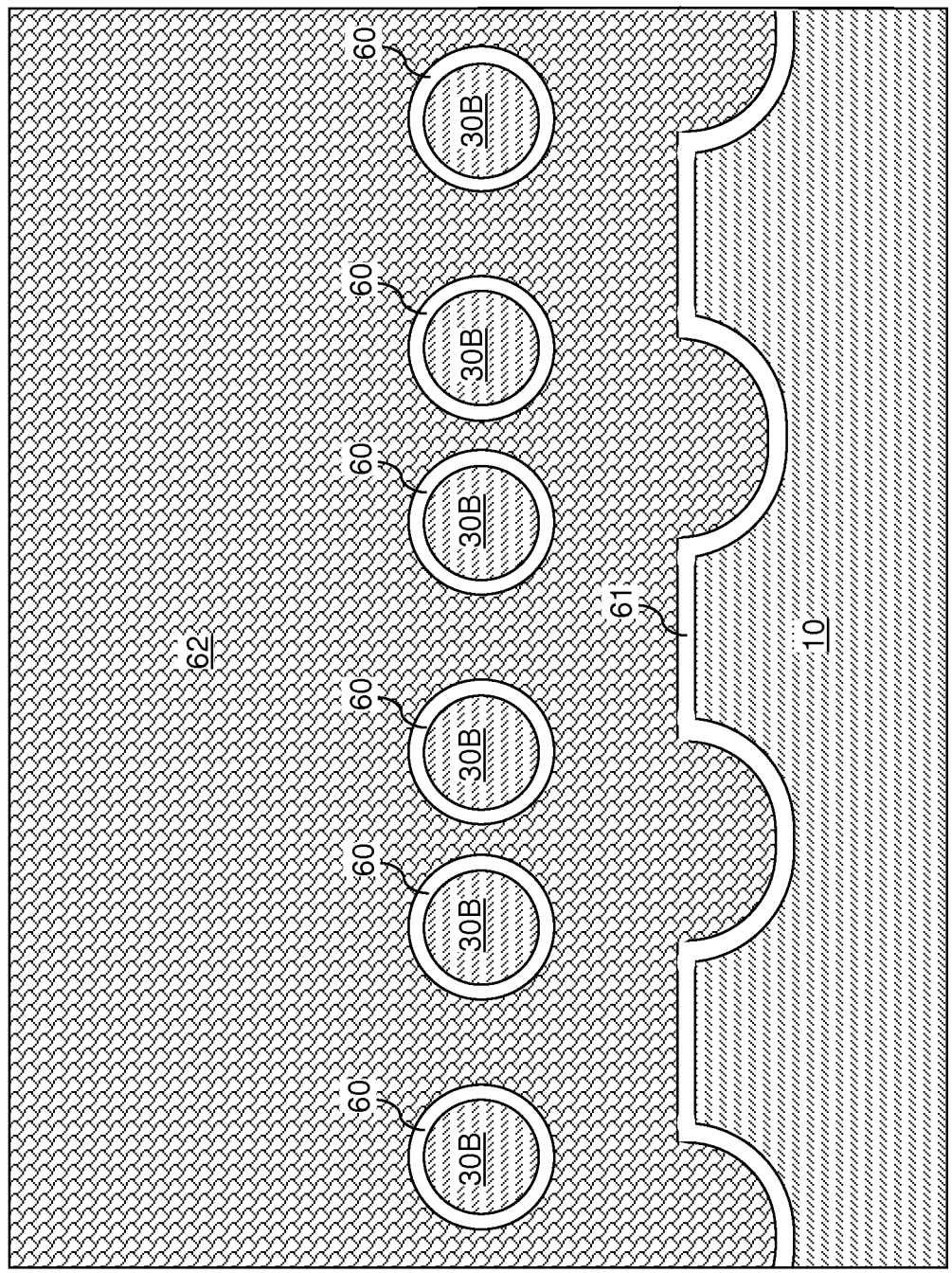
FIG. 13 is a vertical cross-sectional view of the second variation of the exemplary semiconductor structure after formation of a gate dielectric and a gate electrode according to an embodiment of the present disclosure.

Referring to FIG. 13, the processing steps of FIGS. 9A-9D can be optionally performed. Further, the processing steps of FIGS. 10A-10C can be performed to form a field effect transistor.

Figure 14:
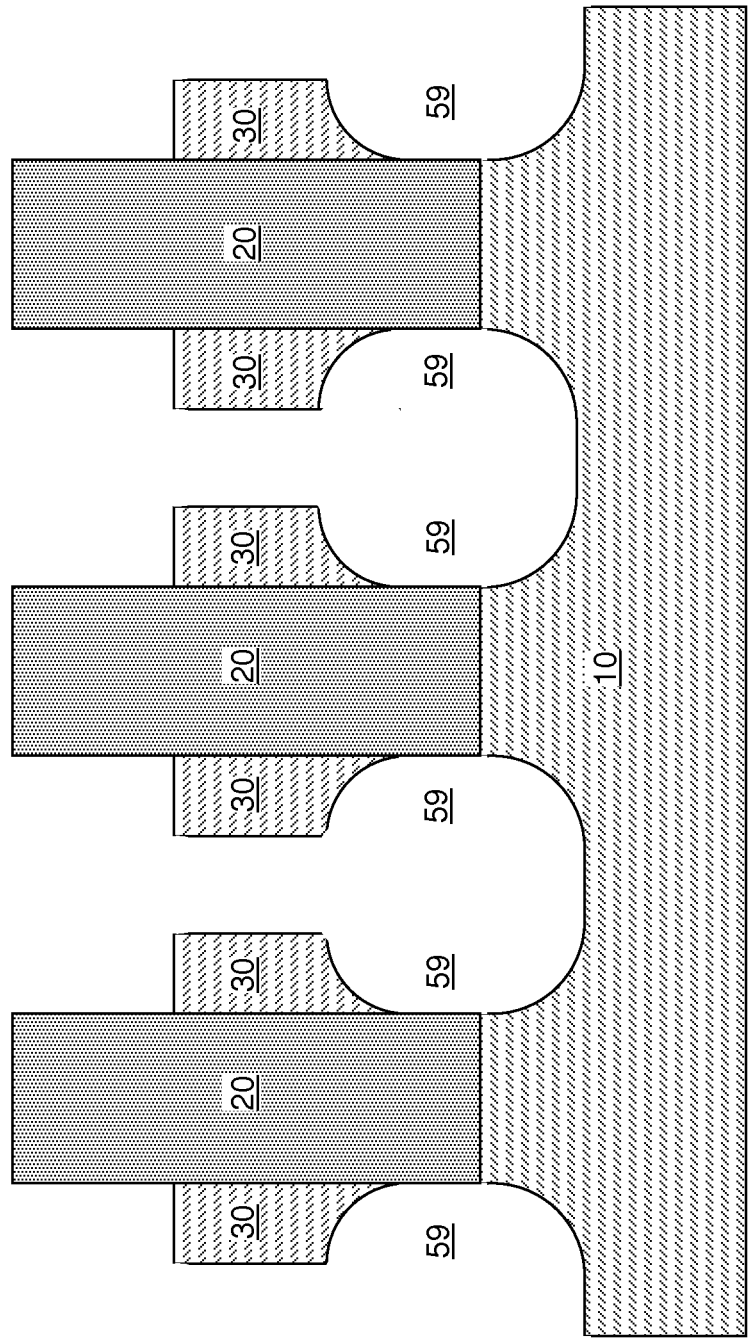
FIG. 14 is a vertical cross-sectional view of a third variation of the exemplary semiconductor structure after removal of the first and second dielectric spacers according to an embodiment of the present disclosure.

Referring to FIG. 14, a third variation of the exemplary semiconductor structure can be derived from the second variation of the exemplary semiconductor structure of FIG. 12 by removing the first and second dielectric spacers (40, 50) employing the processing steps of FIGS. 11A-11D. Subsequently, the processing steps of FIGS. 9A-9D may be optionally performed. Further, the processing steps of FIGS. 10A-10C can be performed to form a field effect transistor.

The methods of the present disclosure can be employed to form semiconductor nanowires without employing a semiconductor-on-insulator (SOI) substrate. Thus, semiconductor nanowires can be formed in an inexpensive manner.

While the present disclosure has been particularly shown and described with respect to preferred embodiments thereof, it will be understood by those skilled in the art that the foregoing and other changes in forms and details may be made without departing from the spirit and scope of the present disclosure. Each of the embodiments described herein can be implemented individually or in combination with any other embodiment unless expressly stated otherwise or clearly incompatible. It is therefore intended that the present disclosure not be limited to the exact forms and details described and illustrated, but fall within the scope of the appended claims.

What is claimed is:

1. A method of forming a semiconductor structure comprising:
    forming a mandrel structure on first portion of a surface of a substrate semiconductor layer;
    forming an epitaxial semiconductor layer on a second portion of said surface of said substrate semiconductor layer;
    forming a first dielectric spacer on sidewalls of said mandrel structure and on portions of a top surface of said epitaxial semiconductor layer;
    recessing physically exposed portions of said epitaxial semiconductor layer employing said first dielectric spacer as an etch mask to form recessed portions of said epitaxial semiconductor layer;
    forming a second dielectric spacer on sidewalls of said first dielectric spacer and sidewalls of recessed portions of said epitaxial semiconductor layer; and
    forming a ring-shaped semiconductor nanowire by etching said epitaxial semiconductor layer from said recessed portions, wherein a remaining portion of said epitaxial semiconductor layer is said ring-shaped semiconductor nanowire.

2. The method of claim 1, further comprising forming a pair of support structures by patterning said mandrel structure, wherein two portions of said ring-shaped semiconductor nanowire become suspended over said substrate semiconductor layer by said pair of support structures.

3. The method of claim 2, wherein said patterning of said mandrel structure comprises:
    covering end portions of said mandrel structure with a patterned mask layer, while physically exposing a portion of said mandrel structure between said end portions; and
    removing the mandrel structure between said end portions.

4. The method of claim 2, further comprising rounding a shape of a vertical cross-sectional area of said ring-shaped semiconductor nanowire by annealing said ring-shaped semiconductor nanowire.

5. The method of claim 2, further comprising forming a gate dielectric and a gate electrode on a suspended portion of said ring-shaped semiconductor nanowire.

6. The method of claim 1, wherein said epitaxial semiconductor layer is formed in epitaxial alignment with a single crystalline structure of said substrate semiconductor layer.

7. The method of claim 1, wherein said epitaxial semiconductor layer comprises a different semiconductor material than said substrate semiconductor layer.

8. The method of claim 7, wherein said etching of said epitaxial semiconductor layer from said recessed portions comprises etching a semiconductor material of said epitaxial semiconductor layer selective to another semiconductor material of said substrate semiconductor layer.

9. The method of claim 1, wherein said etching of said epitaxial semiconductor layer from said recessed portions comprises etching a semiconductor material of said epitaxial semiconductor layer and a portion of said substrate semiconductor layer.

10. The method of claim 1, further comprising removing all portions of said first dielectric spacer and said second dielectric spacer selective to said ring-shaped semiconductor nanowire.

* * * * *